(12) United States Patent
Tsuda

(10) Patent No.: US 11,069,581 B2
(45) Date of Patent: Jul. 20, 2021

(54) METHOD OF MANUFACTURING SEMICONDUCTOR DEVICE

(71) Applicant: RENESAS ELECTRONICS CORPORATION, Tokyo (JP)

(72) Inventor: Shibun Tsuda, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 43 days.

(21) Appl. No.: 16/719,385

(22) Filed: Dec. 18, 2019

(65) Prior Publication Data

US 2020/0211909 A1 Jul. 2, 2020

(30) Foreign Application Priority Data

Dec. 26, 2018 (JP) .............................. JP2018-243513

(51) Int. Cl.
*H01L 21/84* (2006.01)
*H01L 21/8234* (2006.01)
*H01L 27/12* (2006.01)

(52) U.S. Cl.
CPC ...... *H01L 21/84* (2013.01); *H01L 21/823437* (2013.01); *H01L 21/823462* (2013.01); *H01L 21/823468* (2013.01); *H01L 27/1207* (2013.01)

(58) Field of Classification Search
CPC .......................... H01L 21/84; H01L 27/1207
See application file for complete search history.

(56) References Cited

U.S. PATENT DOCUMENTS

| | | | |
|---|---|---|---|
| 9,202,761 B2 | 12/2015 | Makiyama et al. | |
| 10,026,744 B2 | 7/2018 | Yamakoshi et al. | |
| 10,109,638 B1 | 10/2018 | Zhu et al. | |
| 2005/0045951 A1 | 3/2005 | Yamada et al. | |
| 2011/0049629 A1 | 3/2011 | Ishikawa et al. | |
| 2012/0146148 A1 | 6/2012 | Iwamatsu | |
| 2014/0312404 A1 | 10/2014 | Chou et al. | |
| 2016/0204128 A1 | 7/2016 | Baars et al. | |

FOREIGN PATENT DOCUMENTS

| | | |
|---|---|---|
| JP | 2013-084766 A | 5/2013 |
| JP | 2018-026457 A | 2/2018 |

OTHER PUBLICATIONS

Extended European Search Report issued in corresponding European Patent Application No. 19215258.5-1230, dated Aug. 25, 2020.

*Primary Examiner* — John A Bodnar
(74) *Attorney, Agent, or Firm* — McDermott Will & Emery LLP

(57) ABSTRACT

The reliability of the semiconductor device is suppressed from deteriorating. A first gate electrode is formed on the semiconductor layer SM located in the SOI region 1A of the substrate 1 having the semiconductor base material SB, the insulating layer BX, and the semiconductor layer SM via the first gate insulating film, a second gate electrode is formed on the semiconductor base material SB located in the first region 1Ba of the bulk region 1B and on which the epitaxial growth treatment is performed via the second gate insulating film, and a third gate electrode is formed on the semiconductor base material SB located in the second region 1Bb of the bulk region 1B and on which the epitaxial growth treatment is not performed via the third gate insulating film.

17 Claims, 24 Drawing Sheets

METHOD OF MANUFACTURING SEMICONDUCTOR DEVICE

CROSS-REFERENCE TO RELATED APPLICATIONS

The disclosure of Japanese Patent Application No. 2018-243513 filed on Dec. 26, 2018 including the specification, drawings and abstract is incorporated herein by reference in its entirety.

BACKGROUND

The present invention relates to the manufacturing method of semiconductor device, for example, the present invention relates to a technique which can be applied to semiconductor device using SOI substrate.

Patent Document 1 discloses that a semiconductor integrated circuit device having a so-called hybrid substrate structure in which an SOI structure (SOI type MISFET forming region Rs) and a bulk structure (bulk type MISFET forming region Rb) are mixed is manufactured by a gate last method. Specifically, Document 1 describes a technique related to a semiconductor integrated circuit device including an SOI (Silicon On Insulator) type MISFET (Metal Insulator Semiconductor Field Effect Transistor) of a metal gate electrode and a bulk-type MISFET of a polysilicon gate electrode.

Patent Document 2 discloses a semiconductor device having a storage region 1A in which a memory element (memory element, memory cell) MC of a nonvolatile memory is formed, a low withstand voltage MISFET forming region 1B in which a low withstand voltage MISFET2 is formed, and a high withstand voltage MISFET forming region 1C in which a high withstand voltage MISFET3 is formed, and a technique related to manufacturing method thereof.

SUMMARY

The present inventor has studied to mix a plurality of types of MISFET in a bulk type MISFET forming region (hereinafter referred to as a "bulk region") shown in, for example, Patent Document 1, as in, for example, Patent Document 2. The present inventors have studied adopting metal gate electrode structures not only for the gate electrodes of the MISFET formed in the SOI type MISFET forming region (hereinafter referred to as "SOI region") but also for the gate electrodes of the respective MISFET formed in the above-mentioned bulk region. According to the study by the present inventor, it has been found that if the gate last method shown in the above-mentioned document 1 is simply employed for the above-mentioned structure (structure), the gate electrodes of the respective MISFET cannot be formed into desired shapes, and as a result, the reliability (i.e., electric characteristics) of the semiconductor device may be lowered.

Other objects and novel features will become apparent from the description of this specification and the accompanying drawings.

The typical ones of the embodiments disclosed in the present application will be briefly described as follows.

In the method of manufacturing method the semiconductor device in one embodiment, firstly, after a semiconductor layer located in a bulk region of a substrate and an insulating layer located in the bulk region are removed, the epitaxial growth treatment is performed on a surface of a semiconductor base material located in a first region of the bulk region. And, a first gate electrode is formed on the semiconductor layer located in a SOI region of the substrate via a first gate insulating film, a second gate electrode is formed on the semiconductor base material located in the first region of the bulk region and on which the epitaxial growth treatment is performed via a second gate insulating film, and a third gate electrode is formed on the semiconductor base material located in a second region of the bulk region and on which the epitaxial growth treatment is not performed via a third gate insulating film, respectively. Here, a thickness of the third gate insulating film is larger than a thickness of each of the first gate insulating film and the second gate insulating film. And, each of the first to third gate electrodes is made of a first material. Thereafter, an interlayer insulating film formed on the substrate so as to cover each of the first to third gate electrodes is polished. And, after each of the first to third gate electrodes is exposed from the interlayer insulating film, the first material that comprises each of the first to third gate electrodes is displaced to a second material, which is different from the first material.

In the method of manufacturing the semiconductor device in one embodiment, firstly, after a semiconductor layer located in a bulk region of a substrate and an insulating layer located in the bulk region are removed, the epitaxial growth treatment is performed on a surface of a semiconductor base material located in a first region of the bulk region, thereby forming an epitaxially grown layer. And, a first gate electrode is formed on the semiconductor layer located in a SOI region of the substrate via a first gate insulating film, a second gate electrode is formed on the epitaxially grown layer located in the first region of the bulk region via the second gate insulating film, and a third gate electrode is formed on the semiconductor base material located in a second region of the bulk region and on which the epitaxial growth treatment is not performed via a third gate insulating film, respectively. Here, the third gate insulating film has a first insulating layer comprised of silicon oxide, a second insulating layer comprised of silicon nitride and formed on the first insulating layer, and a third insulating layer comprised of silicon oxide and formed on the second insulating layer. And, a thickness of the third gate insulating film is larger than a thickness of each of the first gate insulating film and the second gate insulating film. Further, each of the first to third gate electrodes is made of polycrystalline silicon. Thereafter, an interlayer insulating film formed on the substrate so as to cover each of the first to third gate electrodes is polished. And, after each of the first to third gate electrodes is exposed from the interlayer insulating film, the gap formed by removing each of the first to third gate electrodes is filled with a metallic film.

Further, in the method of manufacturing the semiconductor device in one embodiment, firstly after a semiconductor layer located in a bulk region of a substrate and an insulating layer located in the bulk region are removed, an epitaxially grown layer is formed by performing the epitaxial growth treatment on each of a surface of a semiconductor base material located in a first region of the bulk region and a surface of the semiconductor base material located in a second portion a second region of the bulk region. And, a first gate electrode is formed on the semiconductor layer located in a SOI region via a first gate insulating film, a second gate electrode is formed on the epitaxially grown layer located in the first region of the bulk region via a second gate insulating film, a third gate electrode is formed on the semiconductor base material located in the first portion of the second region of the bulk region via a third gate insulating film, and a fourth gate electrode is formed on the epitaxially grown layer located in the second portion of the second region of the bulk region via a fourth insulating film. Here, the third gate insulating film has a first insulating layer comprised of silicon oxide, a second insulating layer comprised of silicon nitride and formed on the first insulating layer, and a third insulating layer comprised of silicon oxide and formed on the second insulating layer. And, a thickness of the third gate insulating film is larger than a thickness of each of the first gate insulating film, the second gate insulating film and the fourth gate insulating film. Further, each of the first to fourth gate electrodes is made of a first material. Thereafter, an interlayer insulating film formed on the substrate so as to cover each of the first to fourth gate electrodes is polished. And, after each of the first to fourth gate electrodes is exposed from the interlayer insulating film, the first material that comprises each of the first to fourth gate electrodes is displaced to a second material, which is different from the first material.

According to one embodiment, it is possible to suppress the reliability of the semiconductor device from deteriorating.

DETAILED DESCRIPTION

Figure 1:
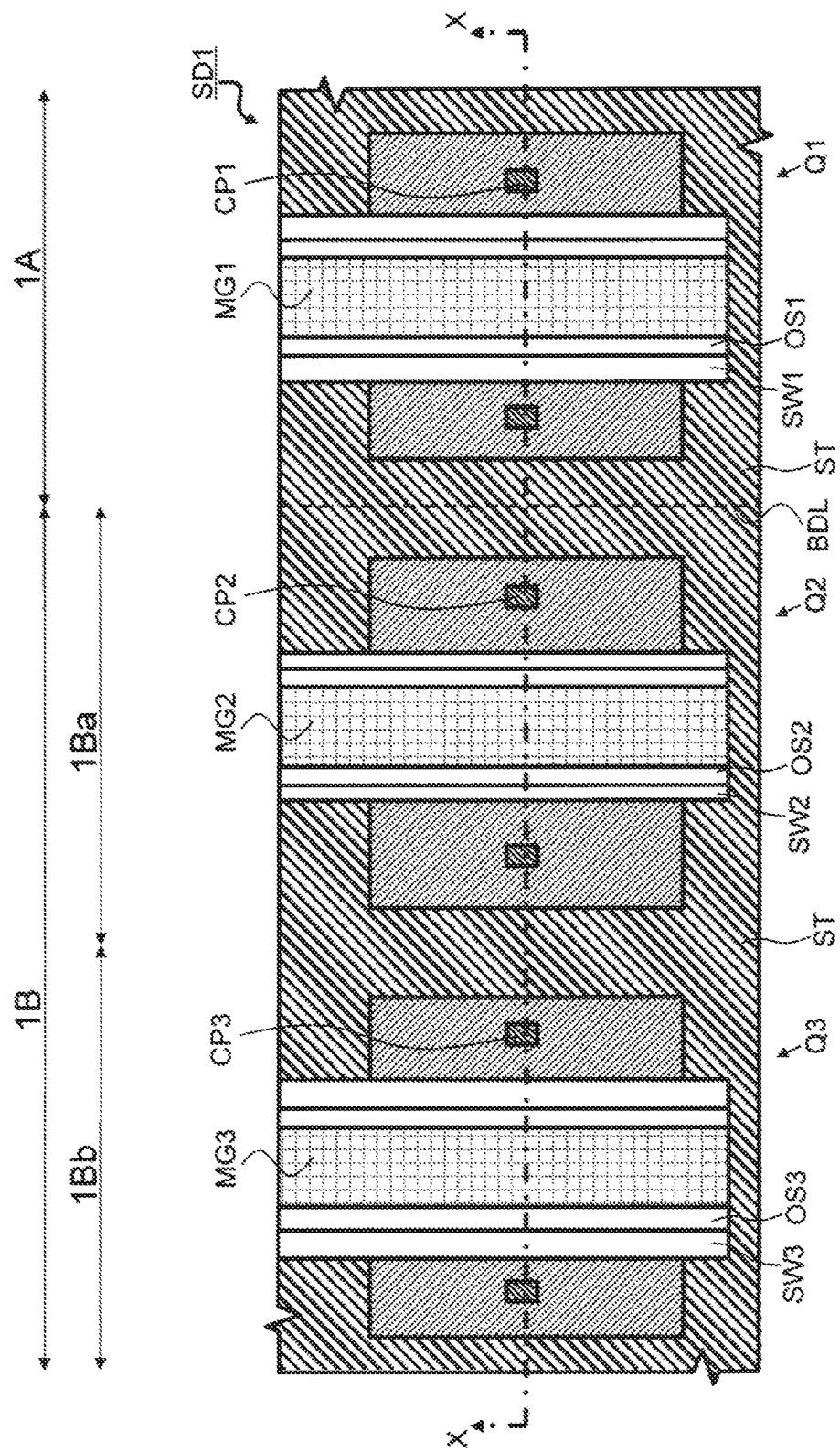
FIG. 1 is a main portion plan view of the semiconductor device of first embodiment.

In the following embodiments, when required for convenience, the description will be made by dividing into a plurality of sections or embodiments, but except when specifically stated, they are not independent of each other, and one is related to the modified example, detail, supplementary description, or the like of part or all of the other. In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle. Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

Details of the embodiments will be described based on the drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In the drawings used in the embodiments, hatching may be omitted even in the case of cross-sectional view in order to make the drawings easier to see. Also, even in the case of a plan view, hatching may be used to make the drawing easier to see.

First Embodiment

Figure 2:
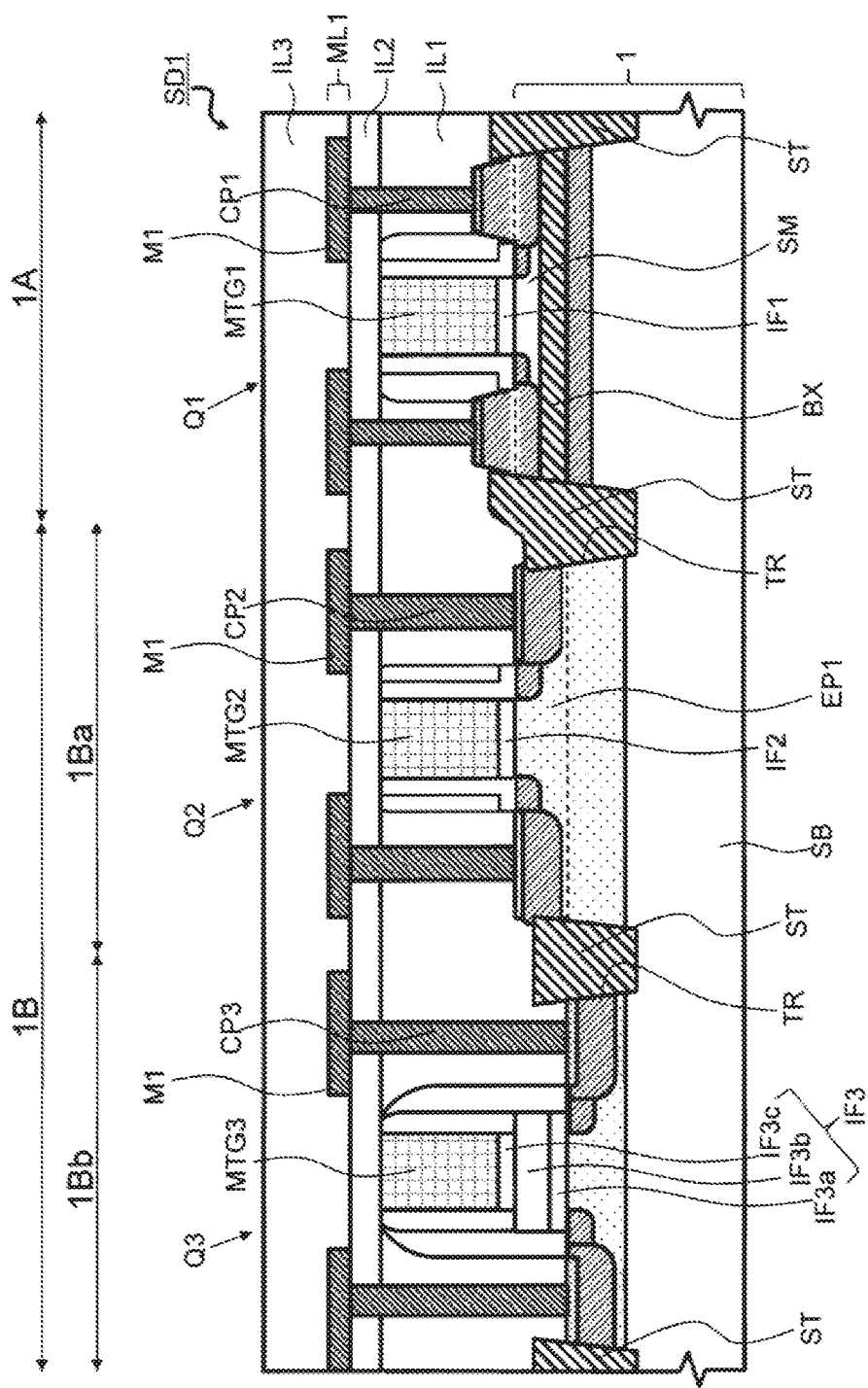
FIG. 2 is a main portion cross-sectional view in X-ray of FIG. 1.

First, the semiconductor device of the present first embodiment will be described with reference to FIGS. 1 and 2. FIG. 1 is a main portion plan view of a semiconductor device SD1 of the present first embodiment. FIG. 2 is a main portion cross-sectional view in X-ray of FIG. 1.

(Semiconductor Device)

As shown in FIGS. 1 and 2, the semiconductor device SD1 includes a plurality of field-effect transistors (MISFET and MOSFET) Q1, Q2, and Q3. Here, as shown in FIGS. 1 and 2, each of the field effect transistors Q1, Q2, and Q3 is formed in a region (active region) that penetrates the semiconductor layer SM and the insulating layer BX and is surrounded by the element isolation portion ST embedded in the trench TR reaching the semiconductor base material SB.

As shown in FIGS. 1 and 2, the semiconductor device SD1 includes a so-called hybrid-structure SOI substrate (substrate) including a part of a semiconductor base material (base material) SB, an insulating layer BX formed on the part of the semiconductor base material SB, an SOI (Silicon On Insulator) region 1A having a semiconductor layer SM formed on the insulating layer BX, and a bulk region 1B not having the insulating layer BX and the semiconductor layer SM. The broken line indicated by the symbol BDL in FIG. 1 indicates the border between the SOI region 1A and the bulk region 1B in plan view for convenience. In FIG. 2, the broken line substantially corresponds to the step surface of the device isolation portion ST formed so as to straddle the border between the SOI region 1A and the bulk region 1B. Further, as shown in FIG. 2, the bulk region 1B has a region (first region 1B a) in which an epitaxially grown layer EP1 is formed on a part of the surface of the semiconductor base material SB by performing epitaxial growth treatment on a part of the semiconductor base material SB, and a region (second region 1B b) in which epitaxial growth treatment is not performed on the surface of the semiconductor base material SB. The epitaxially grown layer EP1 is made of the same material as that of the base material SB.

In the SOI area 1A, a MISFET (Metal Insulator Semiconductor Field Effect Transistor) Q1 constituting, for example, a logic circuit or a digital circuit is formed. In the first region 1B a of the bulk region 1B, for example, a peripheral circuit, specifically, a MISFETQ2 constituting an input/output circuit is formed. Further, in the second region 1Bb of the bulk region 1B, for example, a MISFETQ3 constituting a flash memory is formed.

Here, the gate electrodes of the field-effect transistors (MISFET) Q1, Q2, and Q3 are metal gate electrodes MTG1 and MTG2 and MTG3 made of metal material (metallic film). As shown in FIG. 2, the gate electrode (metal gate electrode MTG1) of the field-effect transistor Q1 is formed on the semiconductor layer SM via the gate insulating film IF1. As shown in FIG. 2, the gate electrode (metal gate electrode MTG2) of the field-effect transistor Q2 is formed on the epitaxially grown layer EP1 via the gate insulating layer IF2. As shown in FIG. 2, the gate electrode (metal gate electrode MTG3) of the field-effect transistor Q3 is formed on the semiconductor base material SB via the gate insulating film IF3.

As shown in FIG. 2, the shapes of the respective gate electrodes (metal gate electrodes MTG1 and MTG2 and MTG3) are substantially the same. The "shape" herein refers to the thickness. On the other hand, as shown in FIG. 2, the thickness of the gate insulating film IF3 is thicker than the thickness of the gate insulating films IF1 and IF2. As shown in FIG. 2, the surface located in the second region 1Bb and in contact with the gate insulating film IF3 (the surface of the semiconductor base material SB) is located in the SOI region 1A, and is located at a position (height) lower than the surface (the surface of the semiconductor layer SM) in contact with the gate insulating film IF1, and the surface (the surface of the epitaxially grown layer EP1) located in the first region 1Ba and in contact with the gate insulating film IF2.

Further, as shown in FIG. 2, the field-effect transistors (MISFET) Q1, Q2, and Q3 are covered with an interlayer insulating film IL1 and an interlayer insulating film IL2 formed on the interlayer insulating film IL1. The sources/drains of the field-effect transistors (MISFET) Q1, Q2, and Q3 are electrically connected to the wirings (wiring patterns) M1 formed in the wiring layer ML1 located on the interlayer insulating film IL2 through the contact plugs CP1, the CP2, and the CP3 formed so as to penetrate the two interlayer insulating films IL1 and IL2. The wires M1 are covered with another interlayer insulating film IL3 formed on the interlayer insulating film IL2.

(Effect Due to Semiconductor Device of First Embodiment)

Next, effects of the semiconductor device SD1 of the present first embodiment will be described below.

In the present first embodiment, as described above, since the gate electrodes of the field-effect transistors (MISFET) Q1, Q2, and Q3 are the metal gate electrodes MTG1, MTG2 and MTG3, respectively, comprised of a metallic film, the semiconductor device speed can be increased as compared with the case where a gate electrode made of, for example, a polycrystalline silicon film (polysilicon film) is employed as the gate electrode of the MISFET. That is, it is possible to cope with miniaturization.

In present first embodiment, as described above, the thickness of the gate insulating film IF2 of the field effect transistor (MISFET) Q2 located in the first region 1Ba in the bulk region 1B is smaller than the thickness of the gate insulating film IF3 of the field effect transistor (MISFET) Q3 located in the second region 1Bb in the bulk region 1B. However, in the present first embodiment, as shown in FIG. 2, the surface of the semiconductor base material in the region where the MISFET (e.g., the field effect transistor Q2) having the gate insulating film having the thin thickness is formed is located above the surface of the semiconductor base material in the region where the MISFET (e.g., the field effect transistor Q3) having the gate insulating film having the thick thickness is formed. Therefore, the shapes of the gate electrodes of the MISFET formed in the regions 1A, 1Ba, and 1Bb can be the substantially same as one another. That is, since the gate electrodes of the respective MISFET can be formed in desired shapes, it is possible to suppress deterioration in reliability, i.e., electric characteristics, of the semiconductor device SD1.

(Method of Manufacturing Semiconductor Device)

Next, the manufacturing method of the semiconductor device of the present first embodiment will be described along the process flows (steps S1 to S8) shown in FIG. 3 and with reference to FIGS. 4 to 15.

1. Preparation of SOI Substrate (Step S1)

Figure 3:
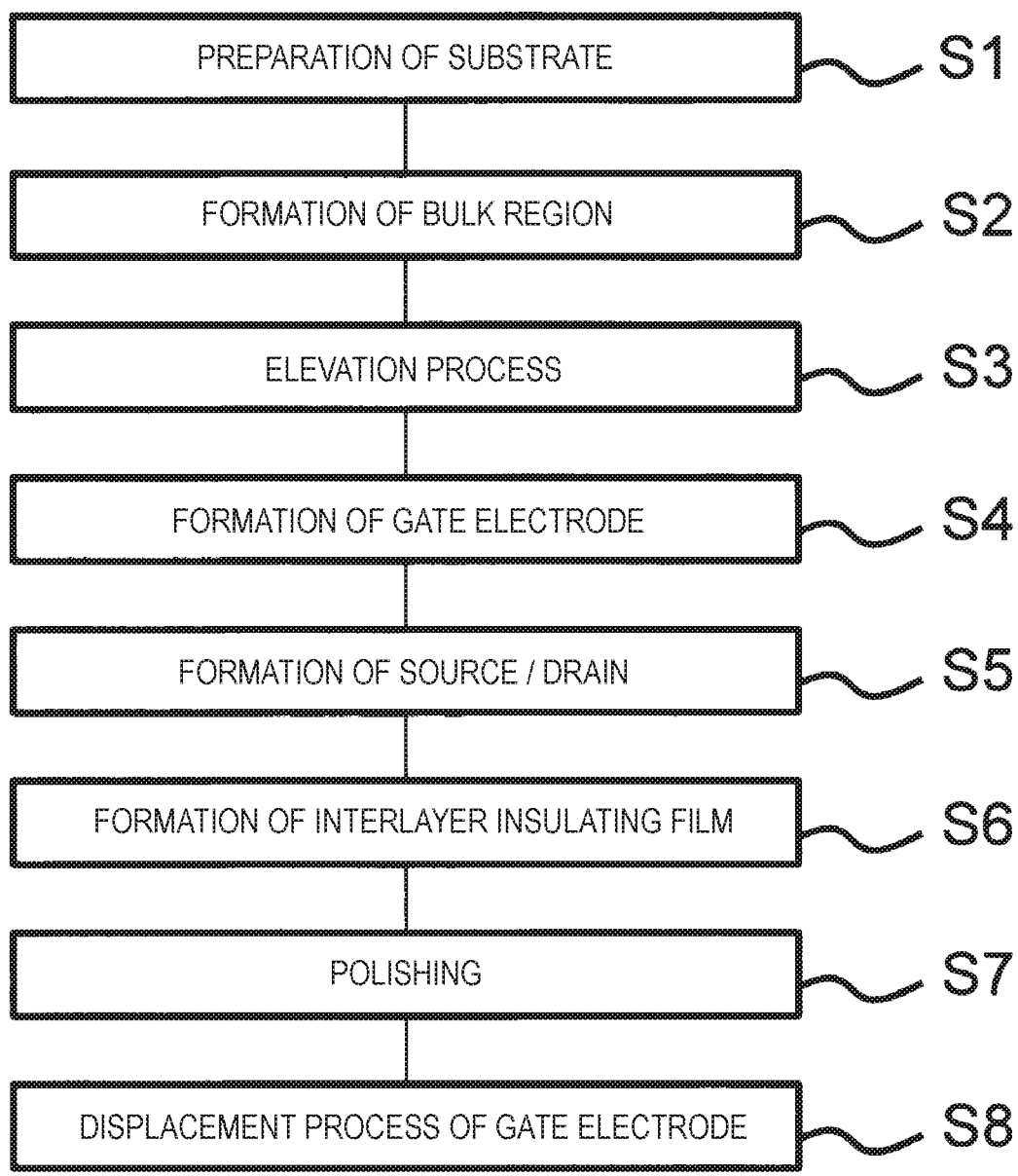
FIG. 3 is a process flow diagram showing the manufacturing process of the semiconductor device of the first embodiment.
Figure 4:
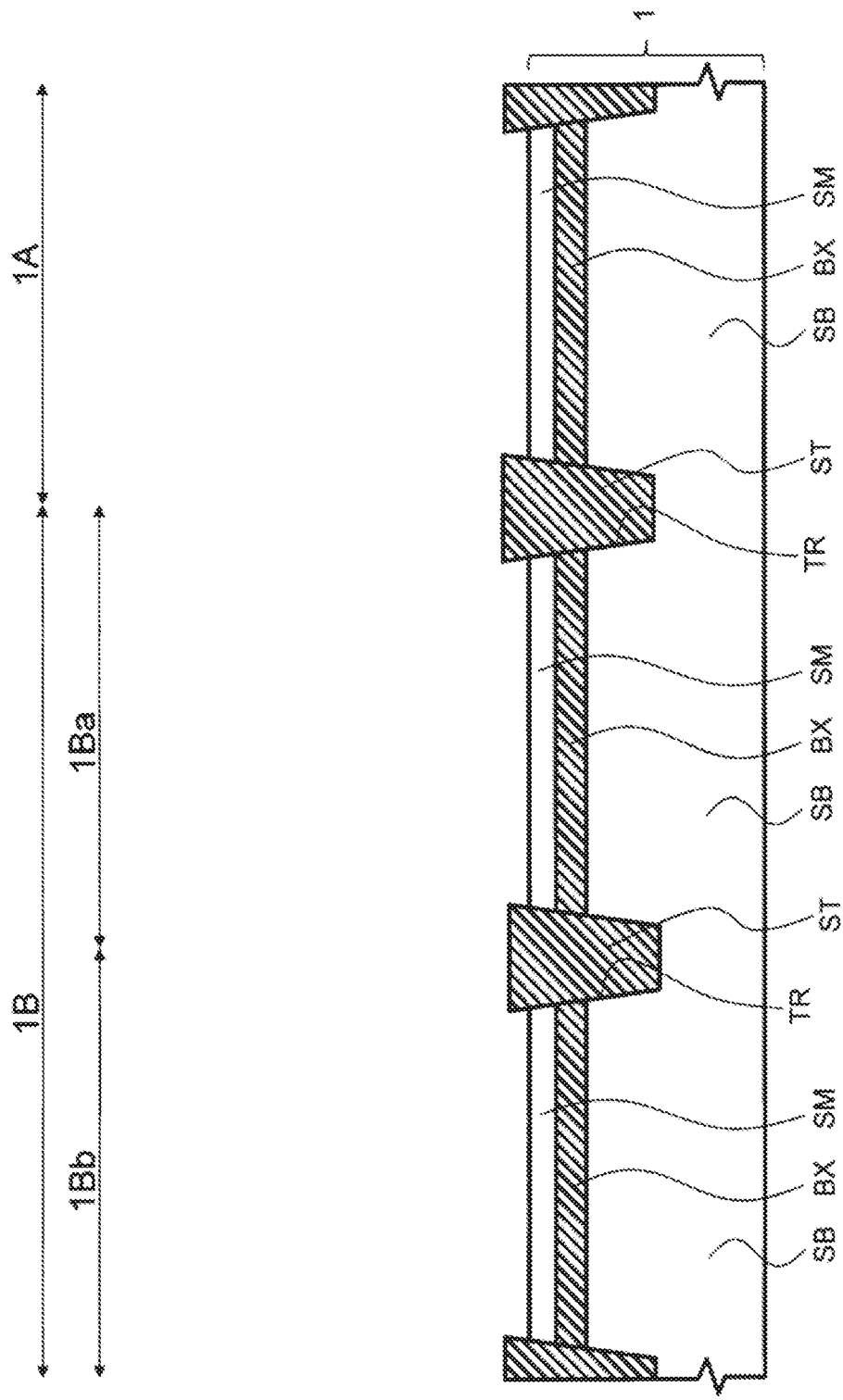
FIG. 4 is a main portion cross-sectional view of the semiconductor device of first embodiment during the manufacturing process.

First, as a step S1 of FIG. 3, a SOI substrate 1 is prepared. In the present embodiment, as shown in FIG. 4, the device isolation portion ST is buried in the trench TR penetrating the semiconductor layer SM and the insulating layer BX and reaching the semiconductor base material SB with respect to the above-mentioned SOI substrate (substrate) 1. In the present first embodiment, for example, the semiconductor base material SB is made of p-type monocrystalline silicon, and the thickness of the semiconductor base material SB is 250 µm to 800 µm. However, the semiconductor base material SB made of n-type monocrystalline silicon may be used as the semiconductor base material SB. For example, the insulating layer BX is made of silicon oxide and has a thickness of 5 nm to 20 nm. For example, the semiconductor layer SM is made of monocrystalline silicon, and the thickness of the semiconductor layer SM is 5 nm to 20 nm, for example. Further, for example, the element isolation portion ST is made of silicon oxide. Here, even if n-type or p-type impurities are not introduced into the semiconductor layer SM by ion implantation, for example, or impurities are introduced into the semiconductor layer SM by ion implantation, the impurity concentrations of the semiconductor layer SM are $1 \times 10^{13}/cm^3$ or less. The trench TR and the element isolation portion ST are formed after the SOI substrate 1 having the semiconductor base material SB, the insulating layer BX, and the semiconductor layer SM is prepared, but descriptions of methods of forming the trench TR and the element isolation portion ST are omitted.

As shown in FIG. 4, the SOI substrate 1 includes a so-called SOI region 1A in which a first MISFET is formed, and a so-called bulk region 1B in which a second MISFET and a third MISFET are formed. Further, the bulk region 1B includes a first region 1Ba in which a second MISFET is formed and a second region 1Bb in which a third MISFET is formed.

2. Formation of Bulk Region (Step S2)

Figure 5:
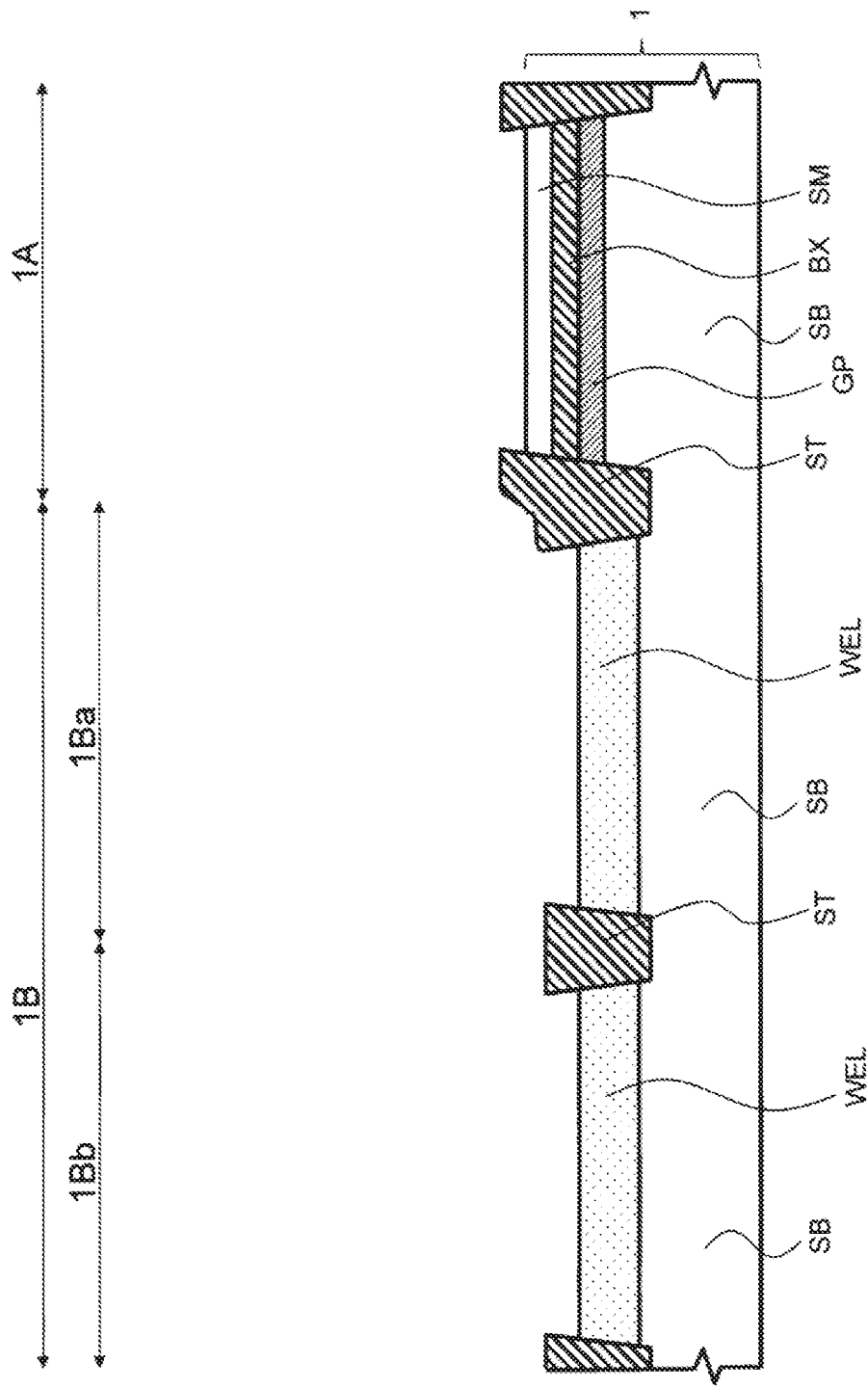
FIG. 5 is a main portion cross-sectional view during the manufacturing process of the semiconductor device following FIG. 4.

Next, as a step S2 in FIG. 3, as shown in FIG. 5, the semiconductor layer SM located in the bulk region 1B and the insulating layer BX located in the bulk region 1B are removed such that each of the semiconductor layer SM located in the SOI region 1A and the insulating layer BX located in the SOI region 1A are not removed. Specifically, a photoresist pattern (resist pattern, mask layer) (not shown) is formed on the semiconductor layer SM located in the SOI region 1A, and the SOI region 1A is covered with the photoresist pattern. Using the photoresist pattern as an etching mask, the semiconductor layer SM located in the bulk region 1B (1Ba, 1Bb) is etched to remove the semiconductor layer SM located in the bulk region 1B (1Ba, 1Bb). As a result, the insulating layer BX located in the bulk regions 1B (1Ba and 1Bb) is exposed. On the other hand, since the SOI region 1A is covered with a photo resist pattern (not shown), the semiconductor layer SM located on the SOI region 1A is not removed. In present first embodiment, for example, isotropic dry etching based on fluorine-radicals is used as the etching process. As the etching gas, for example, SF 6 (sulfur hexafluoride) gas is used. Further, in the present first embodiment, since the etching condition is used in which the etching rate of each of the insulating layer BX and the device isolation portion ST is lower than the etching rate of the semiconductor layer SM, the insulating layer BX exposed by the removal of the semiconductor layer SM can function as an etching stopper.

After removing the photoresist pattern covering the semiconductor layer SM located in the SOI region 1A, performing ion implantation into the semiconductor base material SB located in the SOI region 1A while covering the bulk region 1B with a new photoresist pattern (not shown). As a result, as shown in FIG. 5, semiconductor regions GPs are formed in the semiconductor base material SB located in the SOI region 1A. The semiconductor region GP is a p-type or n-type semiconductor region, and is formed at a position adjacently to the insulating layer BX located in the SOI region 1A. The semiconductor region GP is formed to control a threshold voltage of a MISFET formed in the SOI region 1A. Specifically, in the manufactured semiconductor device, by applying a predetermined voltage to the semiconductor region GP, the threshold voltage of the MISFET formed in the SOI region 1A can be controlled.

Thereafter, the photoresist pattern covering the bulk region 1B when the semiconductor region GP is formed in the SOI region 1A is removed, and the SOI region 1A is covered with a new photoresist pattern (not shown). Then, an impurity is implanted into the semiconductor base material SB located in the bulk region 1B using the photoresist pattern covering the SOI region 1A as a mask (ion implantation blocking mask). As a result, as shown in FIG. 5, a well WEL is formed at a position adjacent to the insulating layer BX located in the bulk region 1B. In present first embodiment, boron, for example, is used as an impurity. That is, the well WEL formed at a position adjoining the insulating layer BX located in the bulk region 1B is a p-type well.

Thereafter, the photoresist pattern covering the 1A of the SOI region is removed. Then, the insulating layer BX located in the bulk region 1B (1Ba, 1Bb) is etched to remove the insulating layer BX located in the bulk region 1B (1Ba, 1Bb). As a result, the state shown in FIG. 5 is obtained. In the present first embodiment, for example, wet etching (isotropic etching) is used as the etching treatment.

3. Elevation Process (Step S3)

Figure 6:
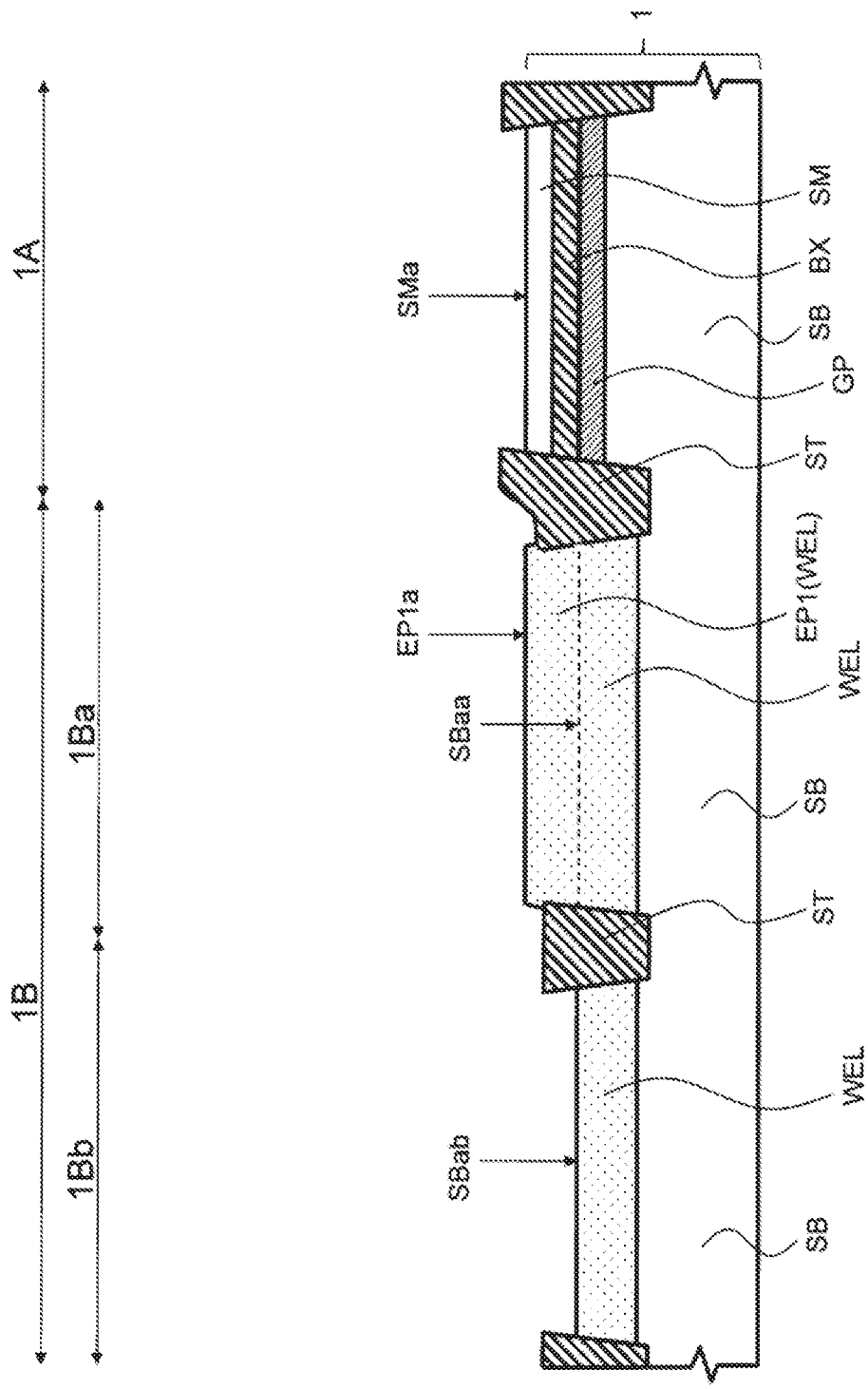
FIG. 6 is a main portion cross-sectional view during the manufacturing process of the semiconductor device following FIG. 5.

Next, as a step S3 of FIG. 3, the SOI region 1A and the second region 1Bb of the bulk region 1B are covered with a protective film (not shown) such that the first region 1Ba of the bulk region 1B is exposed. Then, epitaxial growth is performed on the first area 1Ba of the bulk region 1B to form an epitaxially grown layer EP1 on the surface SBaa of the semiconductor base material SB located in the first region 1Ba (the surface of the semiconductor base material SB exposed by removing the insulating layer BX), as shown in FIG. 6. That is, the upper surface SBaa of the semiconductor base material SB located in the first region 1Ba of the bulk region 1B is lifted (hereinafter also referred to as "elevation treatment"). In the present first embodiment, as shown in FIG. 6, the epitaxial growth treatment is performed so that the upper surface EP1a of the epitaxially grown layer EP1 is located at the substantially same height as the upper surface SMa of the semiconductor layer SM located in the SOI region 1A. Specifically, the epitaxial growth treatment is performed so that the upper surface EP1a of the epitaxially grown layer EP1 is positioned at a height higher than the upper surface SBab of the semiconductor base material SB positioned in the second region 1Bb of the bulk region 1B. The epitaxial growth treatment is performed so that the upper surface EP1a of the epitaxially grown layer EP1 is located at the same height as the upper surface SMa of the semiconductor layer SM located in the SOI region 1A or at a lower height than the upper surface SMa of the semiconductor layer SM located in the SOI region 1A. The reason for this will be described later.

Further, as described above, in the present first embodiment, since the epitaxial growth treatment is performed such that the upper surface EP1a of the epitaxially grown layer EP1 is located at the substantially same height as the upper surface SMa of the semiconductor layer SM located in the SOI region 1A, the thickness of the epitaxially grown layer EP1 formed by the present process is the substantially same as the sum of the thickness of the semiconductor layer SM located in the SOI region 1A and the thickness of the insulating layer BX located in the SOI region 1A. The thickness of the epitaxially growth layer EP1 formed in this step is thicker than the thickness of each of the insulating layer BX and the semiconducting layer SM, for example, 10 nm to 40 nm.

The epitaxially grown layer EP1 formed in this step is made of the same material as the material comprising the base material SB. That is, in the present first embodiment, since the semiconductor base material SB is made of monocrystalline silicon, the epitaxially grown layer EP1 formed in this step is also made of monocrystalline silicon, for example.

After an epitaxially grown layer EP1 is formed in the first region 1Ba of the bulk region 1B, an impurity is implanted into the epitaxially grown layer EP1. As a result, as shown in FIG. 6, a well (semiconducting regions and impurity regions) WEL is formed in the epitaxially grown layer EP1. Here, the type of the impurity implanted into the epitaxially grown layer EP1 is the same as the type of the impurity implanted into the semiconductor base material SB located in the bulk region 1B in the preceding step. This is because the MISFET channel region formed in the first region 1Ba is composed of the well WEL formed in the first region 1Ba and the well WEL formed in the epitaxially grown layer EP1. Thereafter, the protective film (not shown) covering the SOI region 1A and the second region 1Bb of the bulk region 1B is removed.

4. Formation of Gate Electrode

Figure 8:
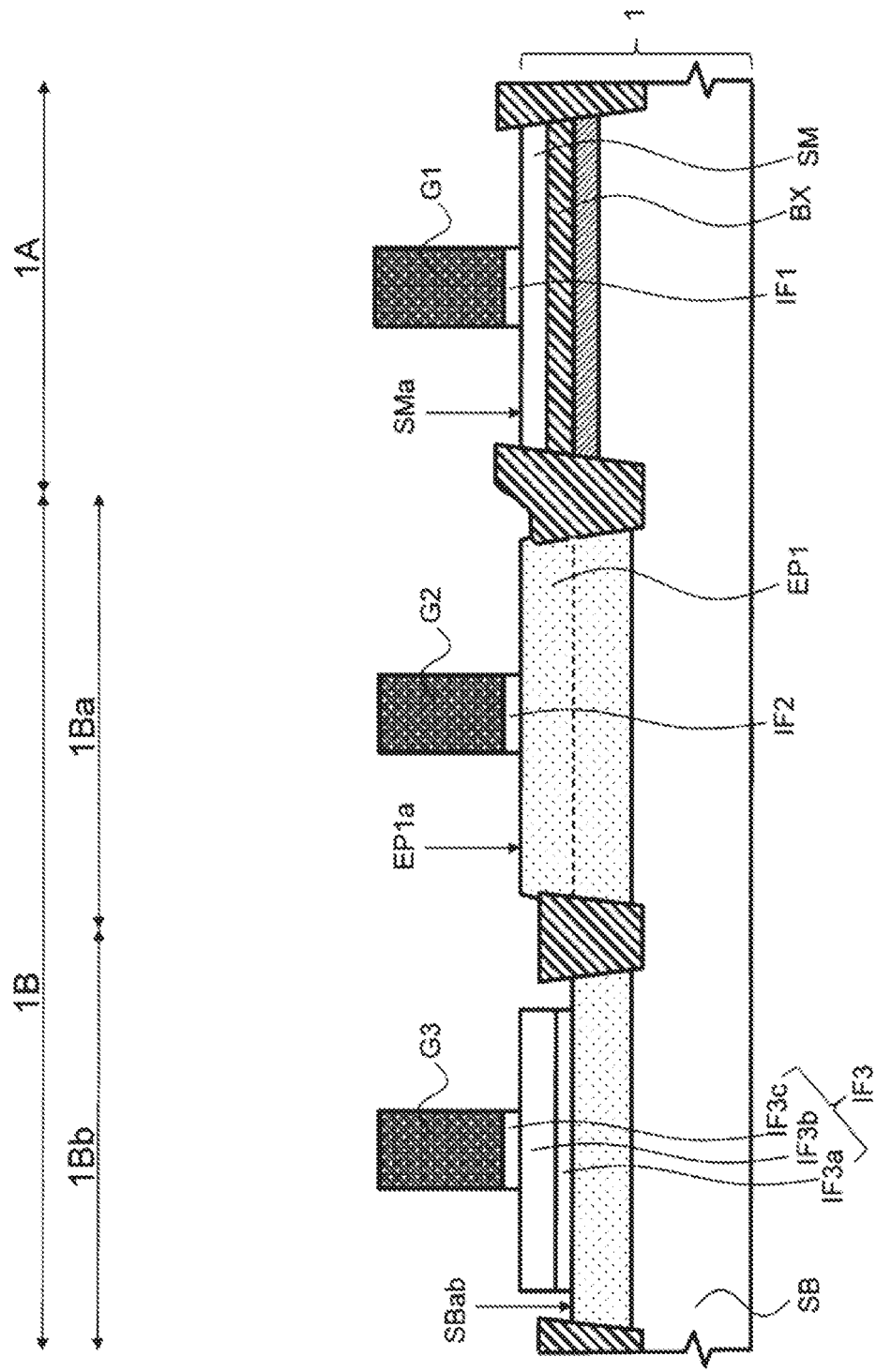
FIG. 8 is a main portion cross-sectional view during the manufacturing process of the semiconductor device following FIG. 7.

Next, as a step S4 in FIG. 3, a gate electrode is formed in the regions 1A and 1B (1Ba and 1Bb). Specifically, as shown in FIG. 8, a gate electrode G1 is formed via a gate insulating film IF1 on the surface SMa of the semiconductor layer SM located in the SOI region 1A, a gate electrode G2 is formed via a gate insulating film IF2 on the surface EP1a of the epitaxially grown layer EP1 located in the first region 1Ba of the bulk region 1B, and a gate electrode G3 is formed via a gate insulating film IF3 on the surface SBab of the semiconductor base material SB located in the second region 1Bb of the bulk region 1B. The thickness of each of the gate electrodes G1, G2, and G3 is, for example, 30 nm to 200 nm. More specifically, each of the gate electrodes G1, G2, and G3 is formed in the following procedure.

Figure 7:
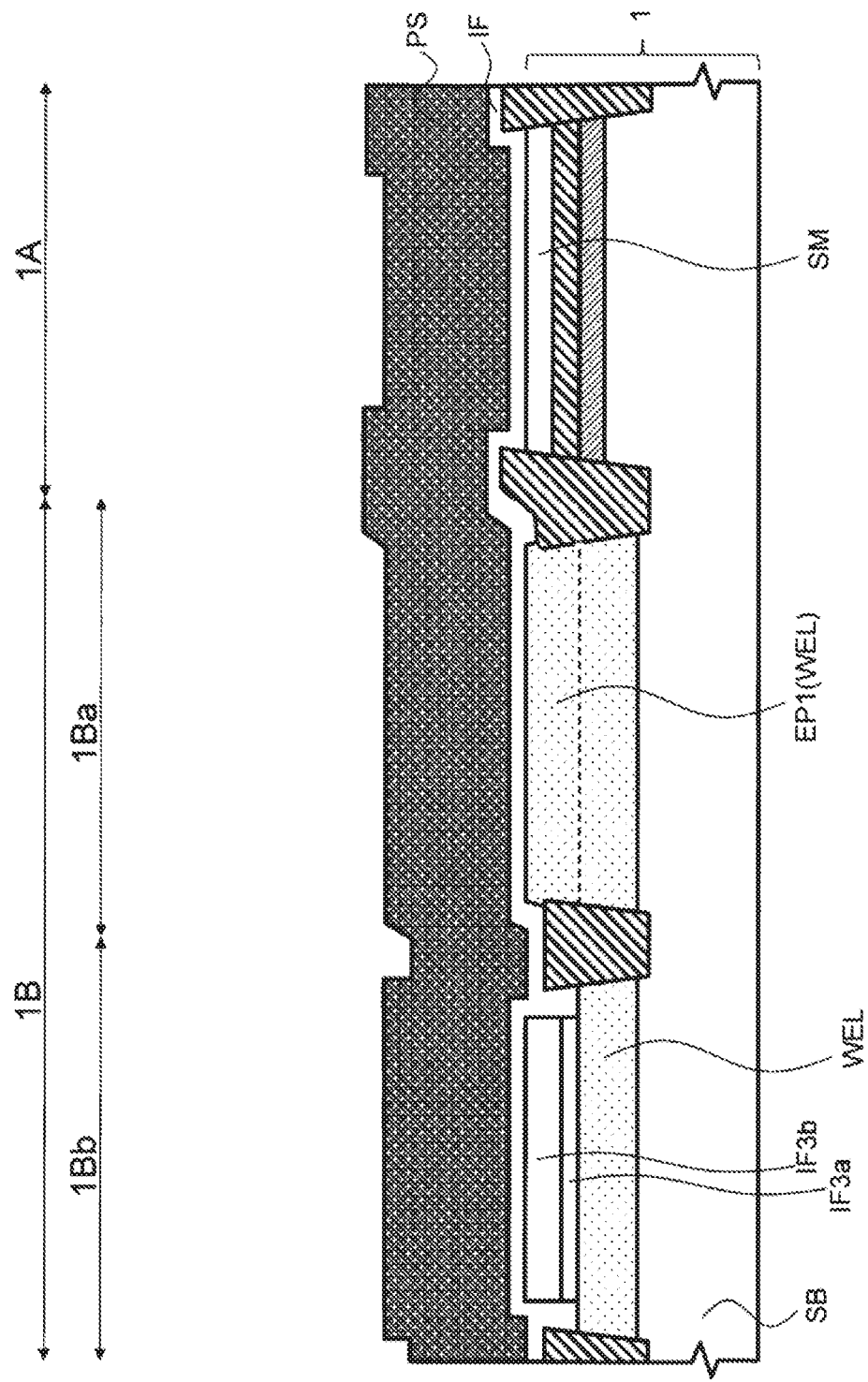
FIG. 7 is a main portion cross-sectional view during the manufacturing process of the semiconductor device following FIG. 6.

First, as shown in FIG. 7, a polycrystalline silicon film (or a doped polysilicon film) PS is deposited on a semiconductor base material SB including the regions 1A, the 1B (1Ba, 1Bb) and the device isolation portions ST via a silicon oxide film IF by, for example, a CVD (Chemical Vapor Deposition) method. Here, in the second area 1Bb, before depositing the insulating film IF on the semiconductor base material SB, insulating layers IF3a and IF3b, which will be described later, are formed in advance. Thereafter, the deposited polycrystalline silicon film PS is patterned by dry etching. The silicon oxide IF is also patterned by etching. As a result, as shown in FIG. 8, the gate electrodes G1, G2, and G3 are formed in the regions 1A and 1B 1Ba and 1Bb together with the gate insulating films IF1, the gate insulating films IF2, and the gate insulating films IF3. That is, in the present first embodiment, the gate electrodes G1, G2, and G3 are formed by one CVD process. The gate electrodes G1, G2, and G3 are made of the same material, i.e., polycrystalline silicon.

Each of the gate insulating film IF1 and the gate insulating film IF2 is made of silicon oxide. On the other hand, as shown in FIG. 8, the gate insulating film IF3 has a three-layer structure. Specifically, the gate insulating film IF3 is formed on the surface SBab of the semiconductor base material SB located in the second region 1Bb of the bulk region 1B, and has an insulating layer IF3a made of silicon oxide, an insulating layer IF3b made of silicon nitride and formed on the insulating layer IF3a, and an insulating layer IF3c made of silicon oxide and formed on the insulating layer IF3b. That is, the insulating layer IF3b is sandwiched between the two insulating layers IF3a and IF3c, and functions as a charge holding layer for confining charges.

The thickness of each of the gate insulating film IF1, the gate insulating film IF2, the insulating layer IF3a, and the insulating layer IF3c is, for example, 2 nm to 4 nm. On the other hand, the thickness of the insulating layer IF3b is, for example, 5 nm to 13 nm. That is, the thickness of the gate insulating film IF3 composed of the three insulating layers IF3a, IF3b, and IF3c is 9 nm to 21 nm, and is thicker than the thickness of the gate insulating film IF1 and the thickness of the gate insulating film IF2. In the present first embodiment, in the previous step, the semiconductor base material SB located in the first region 1Ba of the bulk region 1B is subjected to epitaxial growth treatment. Therefore, as shown in FIG. 8, since the upper surface positions of the gate insulating films IF1, the gate insulating films IF2, and the gate insulating films IF3 (IF3c) are positioned at the substantially same height, the surfaces (upper surface) of the gate electrodes G1, G2, and G3 can also be positioned at the substantially same height.

5. Formation of Source/Drain (Step S5)

Figure 9:
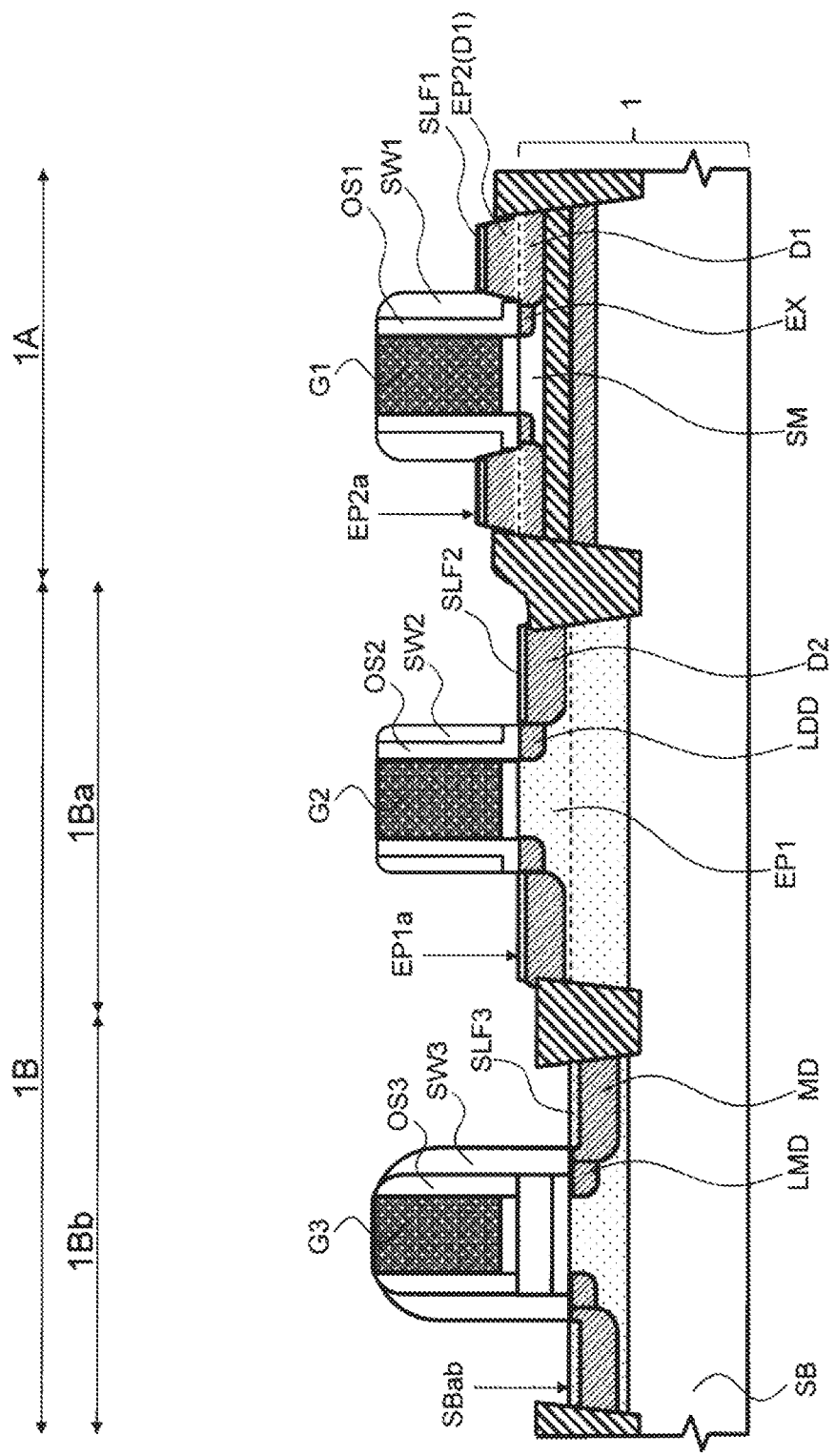
FIG. 9 is a main portion cross-sectional view during the manufacturing process of the semiconductor device following FIG. 8.

Next, a semiconductor region (impurity region) to be served as source/drain, that comprises the MISFET formed in each of the SOI region 1A and bulk region 1B (1Ba, 1Bb), is formed in each region 1A and 1B (1Ba, 1Bb). As shown in FIG. 9, each semiconductor region serving as a source/drain includes semiconductor regions (impurity regions) EX, LDD, and LMD, and semiconductor regions (impurity regions) D1, D2, and MD which are in contact with the semiconductor regions EX, LDD, and LMD and which have an impurity concentration higher than the impurity concentration of the semiconductor regions EX, LDD, and LMD. The low-concentration semiconductor regions EX, LDD, and LMD are formed after the offset spacers OS1, the offset spacers OS2, and the low-concentration semiconductor regions OS3 are formed and before the sidewall spacers SW1, the sidewall spacers SW2, and the sidewall spacers SW3 are formed. Furthermore, the high-concentration semiconductor regions D1, D2, and MD are formed after the sidewall spacers SW1, the sidewall spacers SW2, and the sidewall spacers SW3 are formed. The source/drain regions formed in the respective regions 1A and 1B will be described in detail below.

First, as shown in FIG. 9, the source/drain formed in the SOI region 1A includes, in the semiconductor layer SM, an offset spacer (insulating film) OS1 formed to cover the side surface of the gate electrode G1, a semiconductor region (extension region) EX formed in a portion (position) covered with a sidewall (insulating film) SW1 formed to cover the offset spacer OS1, and a semiconductor region (diffusion region) D1 formed in a portion (position) of the semiconductor layer SM exposed from the offset spacer OS1 and the sidewall SW1.

Here, a portion of the semiconductor layer SM located in the SOI region 1A, which is located directly below the gate electrode G1 and between the semiconductor layer SM serving as a source and the semiconductor layer serving as a drain, serves as a channel region of a MISFET formed in the SOI region 1A. In the present first embodiment, the thickness of the semiconductor layer SM constituting the channel region is as small as 5 nm to nm. Therefore, when a contact hole is formed on a semiconductor region to be a source/drain in a later step, there is a possibility that a contact hole is formed so that the bottom of the contact hole reaches the insulating layer BX located below the semiconductor layer SM or the semiconductor base material SB located below the insulating layer BX.

Therefore, in the present first embodiment, as shown in FIG. 9, the epitaxial growth treatment is performed on the semiconductor layer SM exposed from the gate electrode G1 and the offset spacer OS1, and the epitaxially grown layer EP2 is formed on the surface SMa of the semiconductor layer SM exposed from the gate electrode G1 and the offset spacer OS1. An impurity is also implanted into the epitaxially grown layer EP2 formed. That is, as shown in FIG. 9, the semiconductor region D1 constituting the source/drain formed in the SOI region 1A includes a portion formed in the semiconductor layer SM and a portion formed in the epitaxially grown layer EP2 formed on the semiconductor layer SM.

As shown in FIG. 9, the source/drain formed in the first region 1Ba of the bulk region 1B includes an offset spacer OS2 formed to cover the side surface of the gate electrode G2 in the epitaxially grown layer EP1, a semiconductor region (impurity region) LDD formed in a portion (position) covered with a sidewall SW2 formed to cover the offset spacer OS2, and a semiconductor region (diffusion region) D2 formed in a portion (position) exposed from the offset spacer OS2 and the sidewall SW2 in the epitaxially grown layer EP1. Further, as shown in FIG. 9, the source/drain formed in the second region 1Bb of the bulk region 1B includes a semiconductor region (impurity region) LMD formed in a portion (position) of the semiconductor base material SB covered with the offset spacer OS3 formed to cover the side surface of the gate electrode G3 and the sidewall SW3 formed to cover the offset spacer OS3, and a semiconductor region (diffused region) MD formed in a portion (position) of the semiconductor base material SB exposed from the offset spacer OS3 and the sidewall SW3.

Note that the impurity used for forming the semiconductor regions (extension regions, impurity regions, and diffused regions) serving as the source/drain is an n-type impurity such as phosphorus (P) or arsenic (As) if the MISFET to be formed is an n-type field-effect transistor. On the other hand, impurities used for forming the respective semiconductor regions (extension regions, impurity regions, and diffused regions) are p-type impurities such as boron (B), for example, if the MISFET to be formed is a p-type field-effect transistor.

After forming the semiconductor regions constituting the source/drain of each MISFET, silicide films SLF1, SLF2, and SLF3 are formed on the surfaces EP2a, EP1a, and SBab of the semiconductor regions D1, D2, and MD constituting the source/drain of each MISFET, as shown in FIG. 9.

6. Formation of Interlayer Insulating Film (Step S6)

Figure 10:
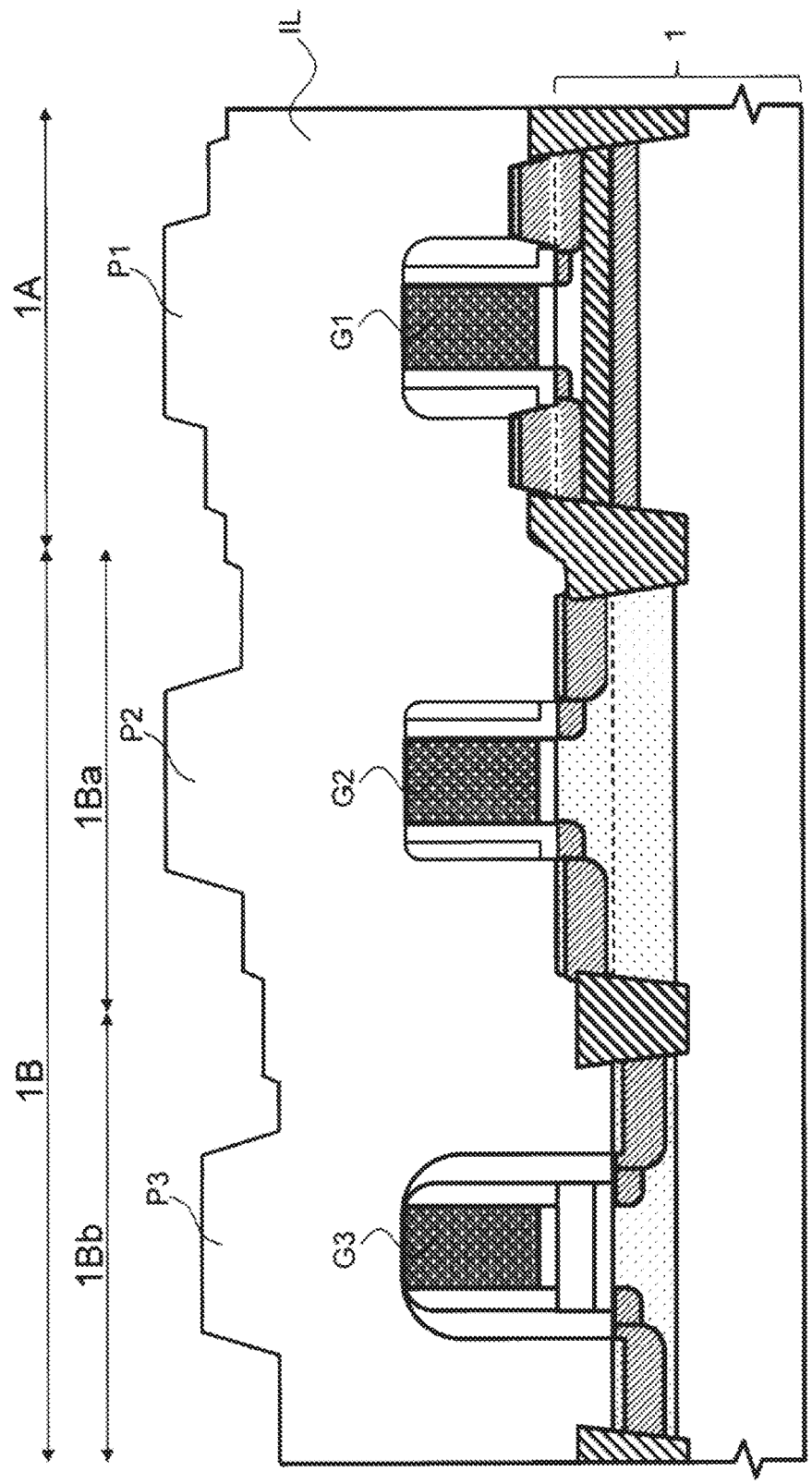
FIG. 10 is a main portion cross-sectional view during the manufacturing process of the semiconductor device following FIG. 9.

Next, as a step S6 of FIG. 3, an interlayer insulating film IL is formed on the substrate 1 so as to cover the gate electrodes G1, G2, and G3 formed in the regions 1A and 1B (1Ba and 1Bb). Here, as shown in FIG. 10, since the gate electrodes G1, G2, and G3 project upward from the surface of the substrate 1, unevenness is formed on the surface of the interlayer insulating film IL in accordance with the thickness (height) of the formed gate electrodes G1, G2, and G3. That is, the convex portions P1, P2, and P3 are formed on the gate electrodes G1, G2, and G3 in the interlayer insulating film IL.

7. Polishing (Step S7)

Figure 11:
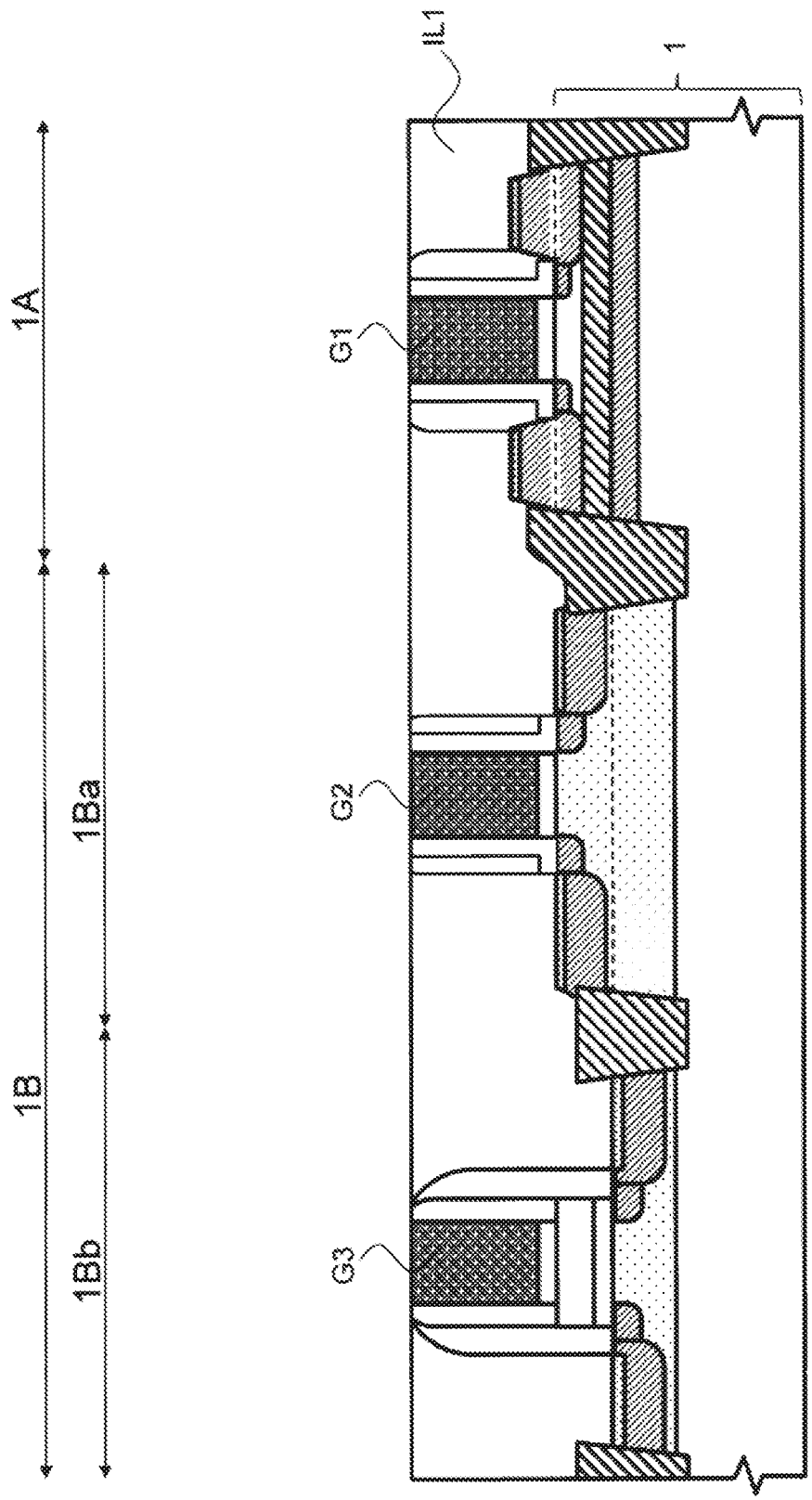
FIG. 11 is a main portion cross-sectional view during the manufacturing process of the semiconductor device following FIG. 10.

Next, as a step S7 of FIG. 3, a portion of the interlayer insulating film 1L is polished. Here, when a MISFET having a gate electrode made of a polysilicon film is manufactured, the polishing quantity of the interlayer insulating film IL is controlled such that the gate electrode is not exposed. On the other hand, the manufacturing method of semiconductor device in present first embodiment forms a MISFET having a gate electrode made of a metallic material. Therefore, in the present first embodiment, as shown in FIG. 11, the interlayer insulating film IL is polished such that the gate electrodes G1, G2, and G3 formed in the regions 1A and 1B 1Ba and 1Bb are exposed from the interlayer insulating film IL. Then, the interlayer insulating film IL1 subjected to the polishing step is formed by the present polishing step. Thereafter, a step of replacing the material constituting each of the gate electrodes G1, G2, and G3 with a metal material different from the polycrystalline silicon film is performed.

8. Displacement Process of Gate Electrode (Step S8)

Next, as a step S8 of FIG. 3, the displacement process of the material comprising the gate electrode will be described.

First, the gate electrodes G1, G2, and G3 exposed from the polished interlayer insulating film IL1 are subjected to, for example, a wet etching process to remove the gate electrodes G1, G2, and G3. As a result, as shown in FIG. 12, a gap GAP1, GAP2 and GAP3 are formed in regions surrounded by the pair of offset spacers OS1, OS2 and OS3 and the gate insulating films IF1, gate insulating films IF2, gate insulating films IF3 (IF3c).

Figure 12:
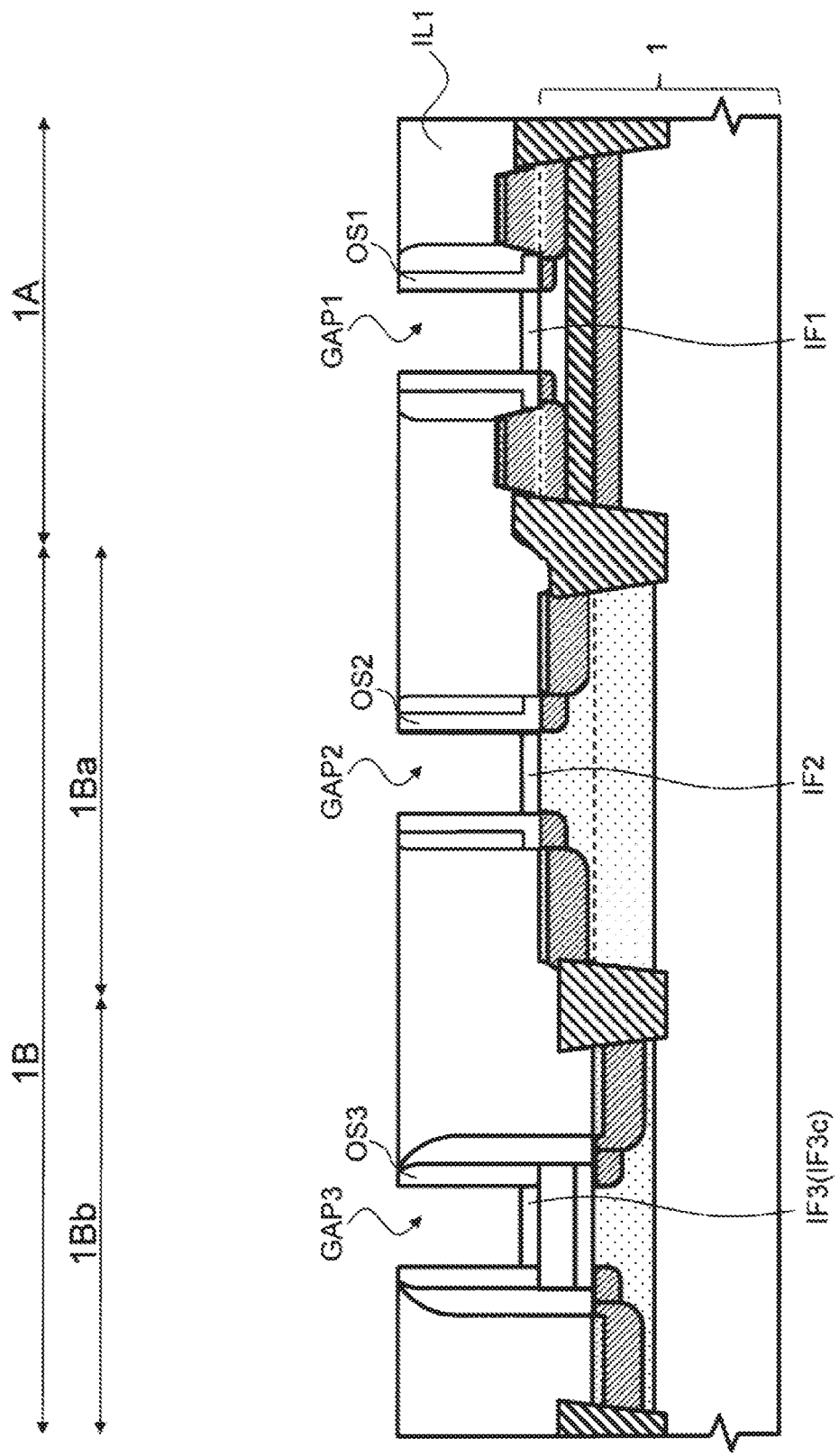
FIG. 12 is a main portion cross-sectional view during the manufacturing process of the semiconductor device following FIG. 11.
Figure 13:
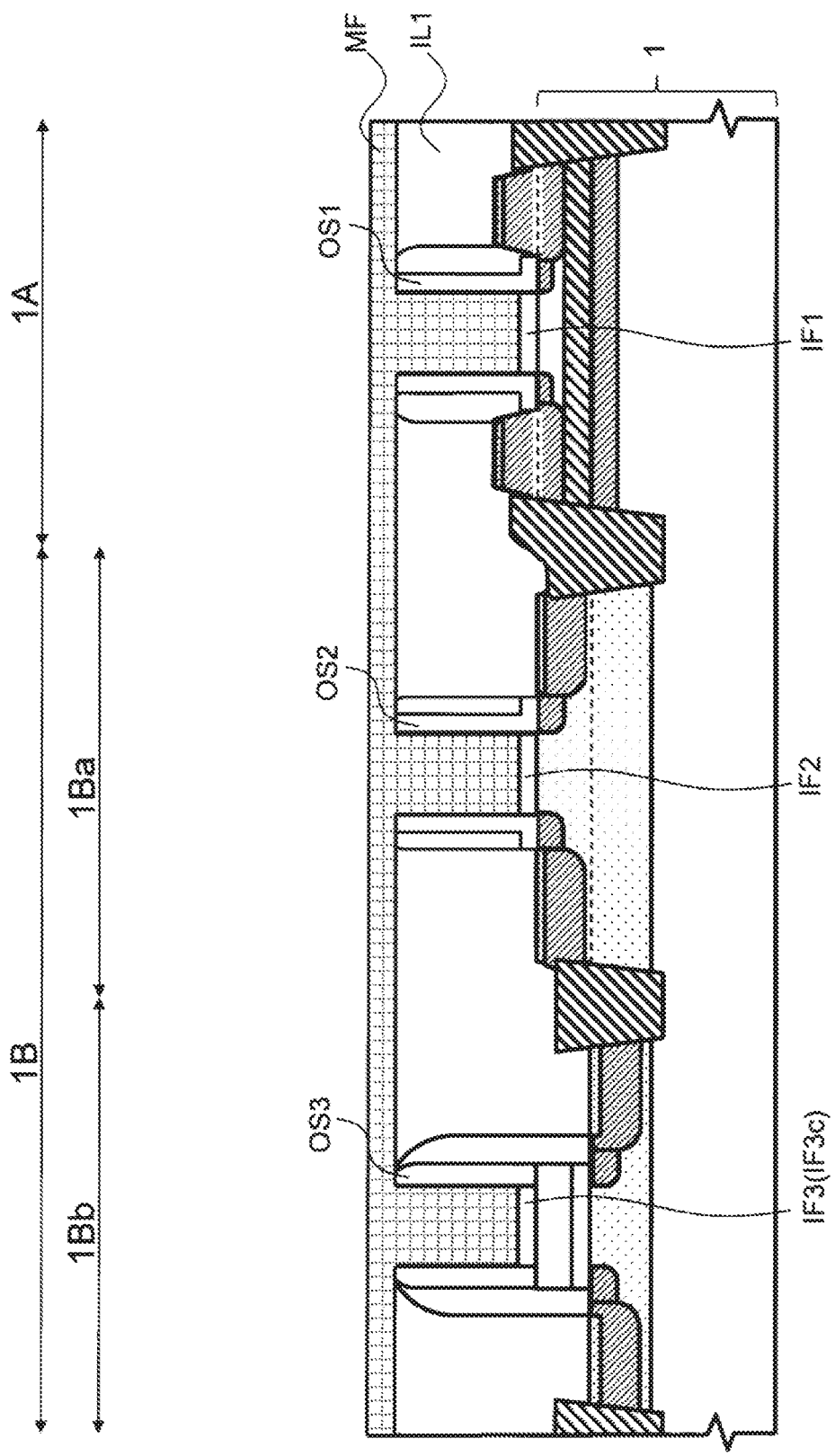
FIG. 13 is a main portion cross-sectional view during the manufacturing process of the semiconductor device following FIG. 12.

Next, as shown in FIG. 13, the metallic film MF is formed on the polished interlayer insulating film IL1 so as to block the spaces GAP1, GAP2, and GAP3 of the regions 1A and 1B 1Ba and 1Bb described in FIG. 12. Here, the metallic film MF is formed by, for example, sputtering. The metallic film MF is made of, for example, titanium nitride. Further, although not shown, the metallic film MF is formed on the polished interlayer insulating film IL1, the offset spacers OS1 and OS2, and the OS3, and on the gate insulating films IF1 and IF2, and IF3 via a gate insulating film (High-k gate insulating film) made of, for example, hafnium-oxide-based high dielectric constant materials. The High-k gate insulating film (HfON, HfO) is formed of, for example, ALCVD (Atomic Layer Chemical Vapor Deposition. The thickness of the high dielectric constant gate insulating film is, for example, several A to several tens A.

Figure 14:
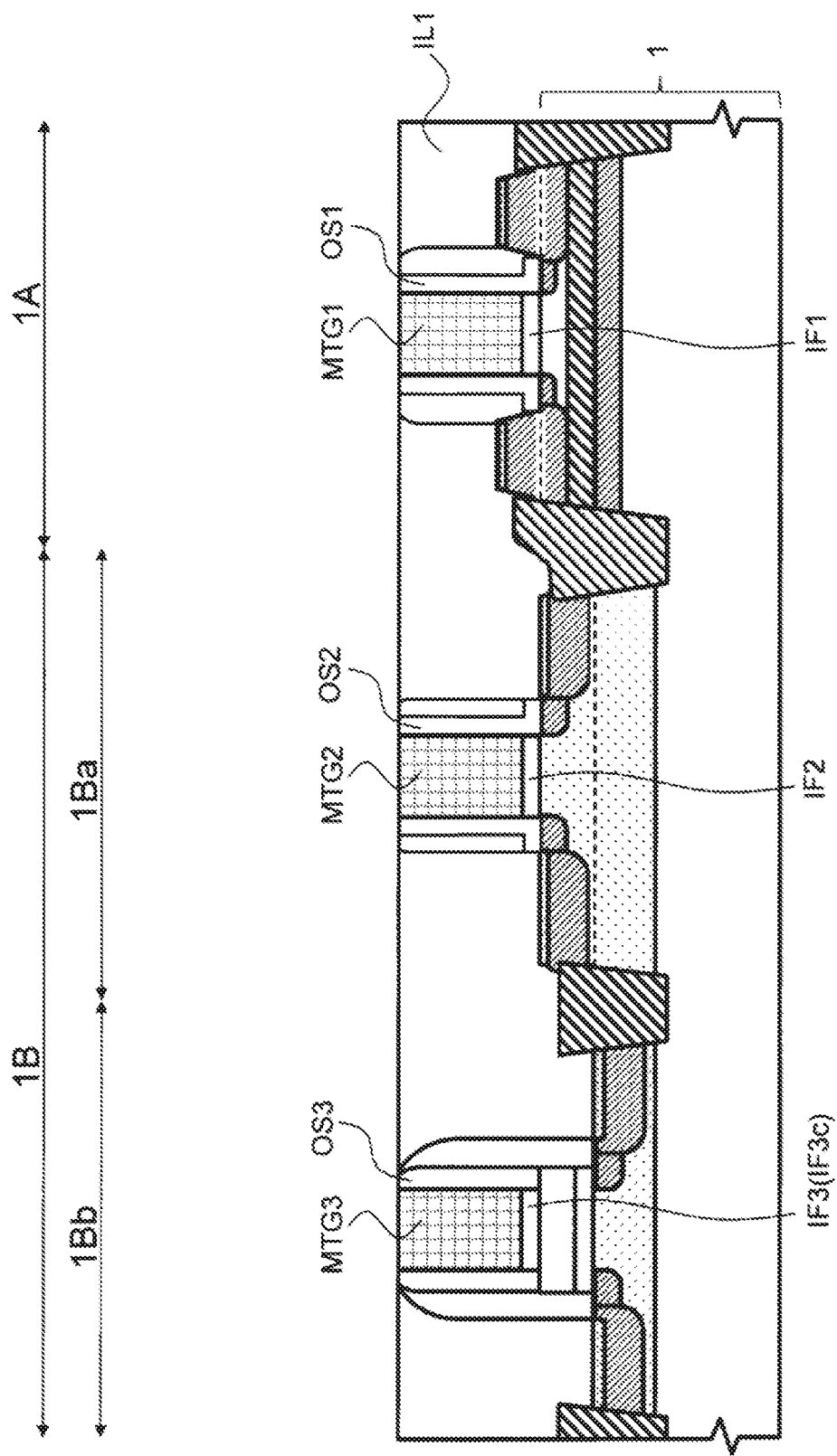
FIG. 14 is a main portion cross-sectional view during the manufacturing process of the semiconductor device following FIG. 13.

Then, as shown in FIG. 14, the gate electrodes (metal gate electrodes) MTG1, MTG2, and MTG3 made of metal materials are formed by removing portions of the metallic film MF (and the High-k gate insulating film) located outside the spaces GAP1, the GAP2, and the GAP3 described in FIG. 12 (i.e., unnecessary portions of the metallic film MF located on the surfaces of the polished interlayer insulating film 1L1). In the present first embodiment, unnecessary portions are removed by, for example, polishing.

Figure 15:
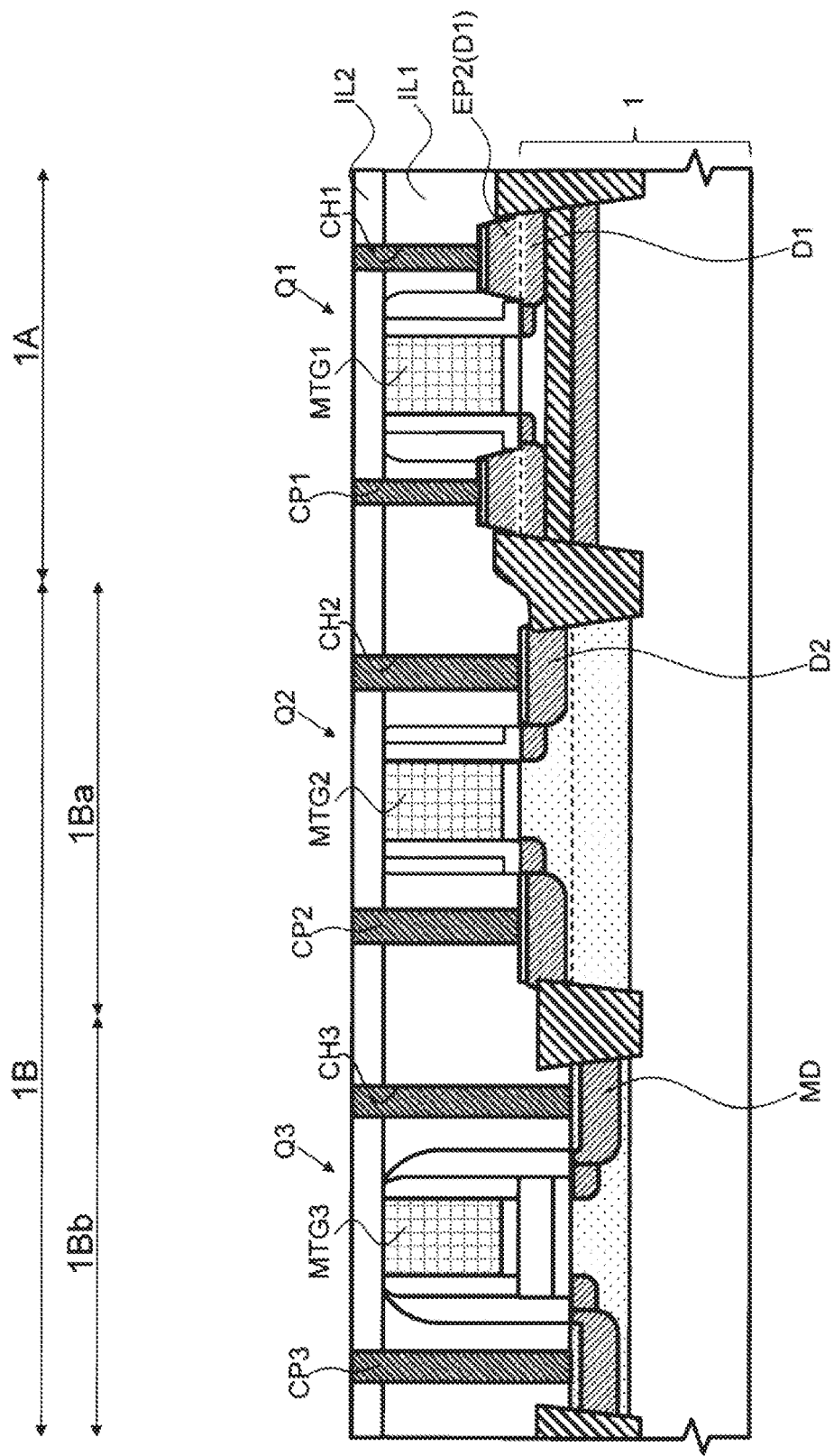
FIG. 15 is a main portion cross-sectional view during the manufacturing process of the semiconductor device following FIG. 14.

Next, as shown in FIG. 15, another interlayer insulating film IL2 is formed on the polished interlayer insulating film IL1 so as to cover the exposed portions of the metal gate electrodes MTG1, MTG2, and MTG3 exposed from the polished interlayer insulating film IL1. Contact holes CH1, CH2, and IL1 are formed in the interlayer insulating films CH3 and IL2 at positions overlapping with the semiconductor regions D1, D2, and MD serving as the sources and drains of the field-effect transistors (MISFET and MOSFET) Q1, Q2, and Q3 having the metal gate electrodes MTG1, MTG2, and MTG3, respectively. The contact holes CH1, the contact holes CH2, and the contact holes CH3 are formed by, for example, photolithography and dry-etching. Then, conductive films made of, for example, tungsten are buried in the contact holes CH1, the CH2, and the CH3, thereby forming contact plugs CP1, the CP2, and the CP3 as shown in FIG. 15. Thereafter, a plurality of wirings (wiring patterns) M1 is formed on the wiring layer ML1 located on the interlayer insulating film IL2, and the plurality of wirings M1 are covered with the interlayer insulating film IL3, whereby the state shown in FIG. 2 is obtained.

(EFFECT DUE TO METHOD OF MANUFACTURING SEMICONDUCTOR DEVICE OF First Embodiment)

Next, the effects due to the method of manufacturing the semiconductor device of present first embodiment will be described in conjunction with several examined examples.

Examined Example 1

First, as described above, the substrate constituting the semiconductor device of the present first embodiment includes not only the SOI region (for example, the SOI region 1A) having the insulating layer and the semiconductor layer formed on the semiconductor base material, but also the bulk region (for example, the bulk region 1B) having neither the insulating layer nor the semiconductor layer. The bulk region includes a region (e.g., first region 1Ba) in which a MISFET having a gate insulating film (e.g., gate insulating film IF2) having a first thickness is formed, and a region (e.g., second region 1Bb) in which a MISFET having a second gate insulating film (e.g., gate insulating film IF3) having a thickness greater than the first thickness is formed. The configuration up to this point is shown as examined example 1 in FIG. 16.

On the other hand, as described above, in the manufacturing method of the semiconductor device of the present first embodiment, first, a temporary gate electrode is formed, and then an offset spacer and a sidewall are sequentially formed so as to cover the side wall of the gate electrode. Semiconductor regions serving as source/drain regions are formed in regions where MISFET is to be formed, i.e., active regions, and then the temporary gate electrodes are covered with an interlayer insulating film. Then, after removing a part of the interlayer insulating film so as to expose a part of the temporary gate electrode, a material (e.g., a metallic film) different from the material (e.g., a polycrystalline silicon film) constituting the temporary gate electrode is buried in the space formed by removing the temporary gate electrode. That is, the manufacturing method of the semiconductor device of present first embodiment is a so-called gate last process.

Figure 16:
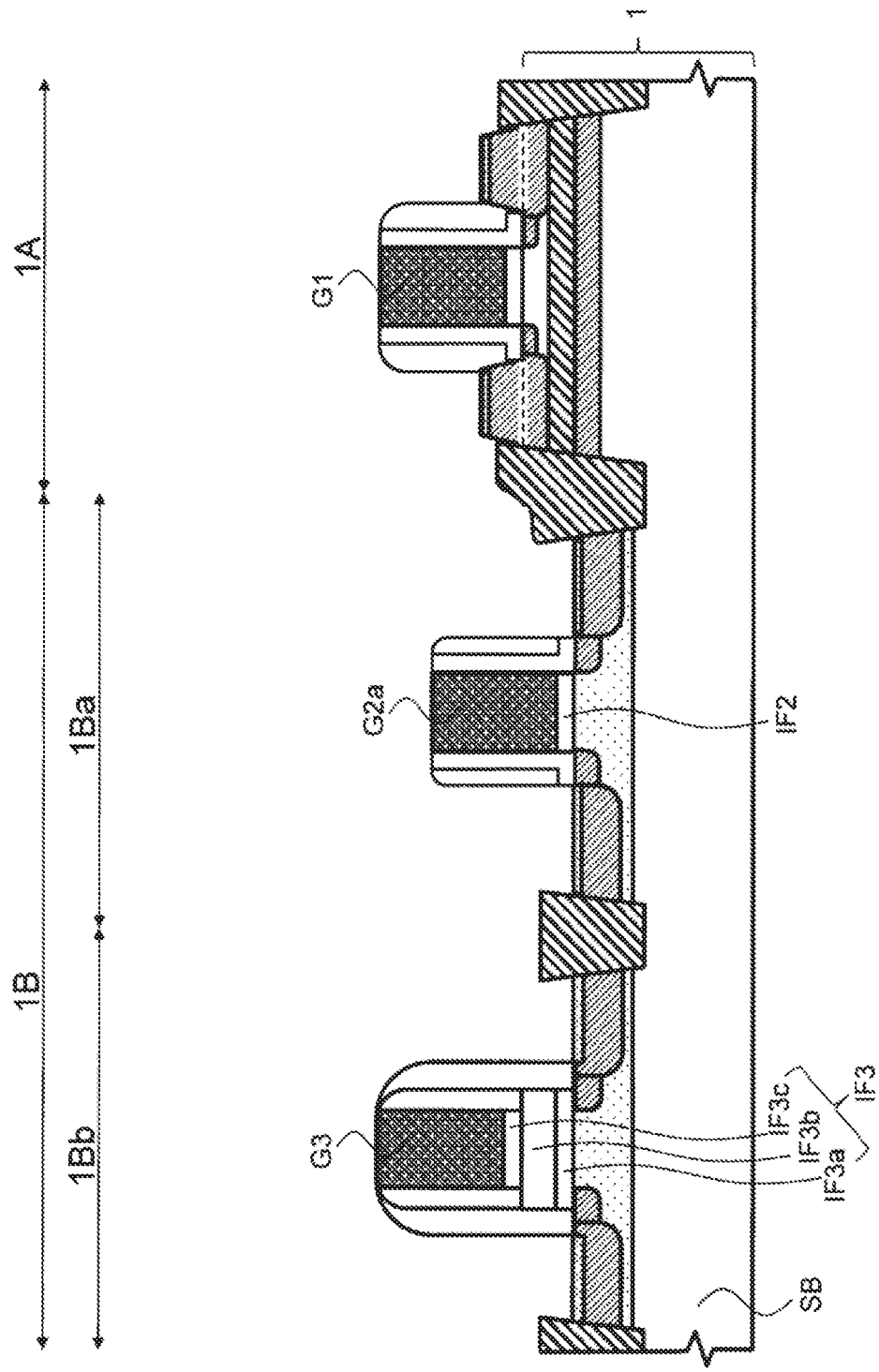
FIG. 16 is a main portion cross-sectional view during the manufacturing process of the semiconductor device of examined example 1.
Figure 17:
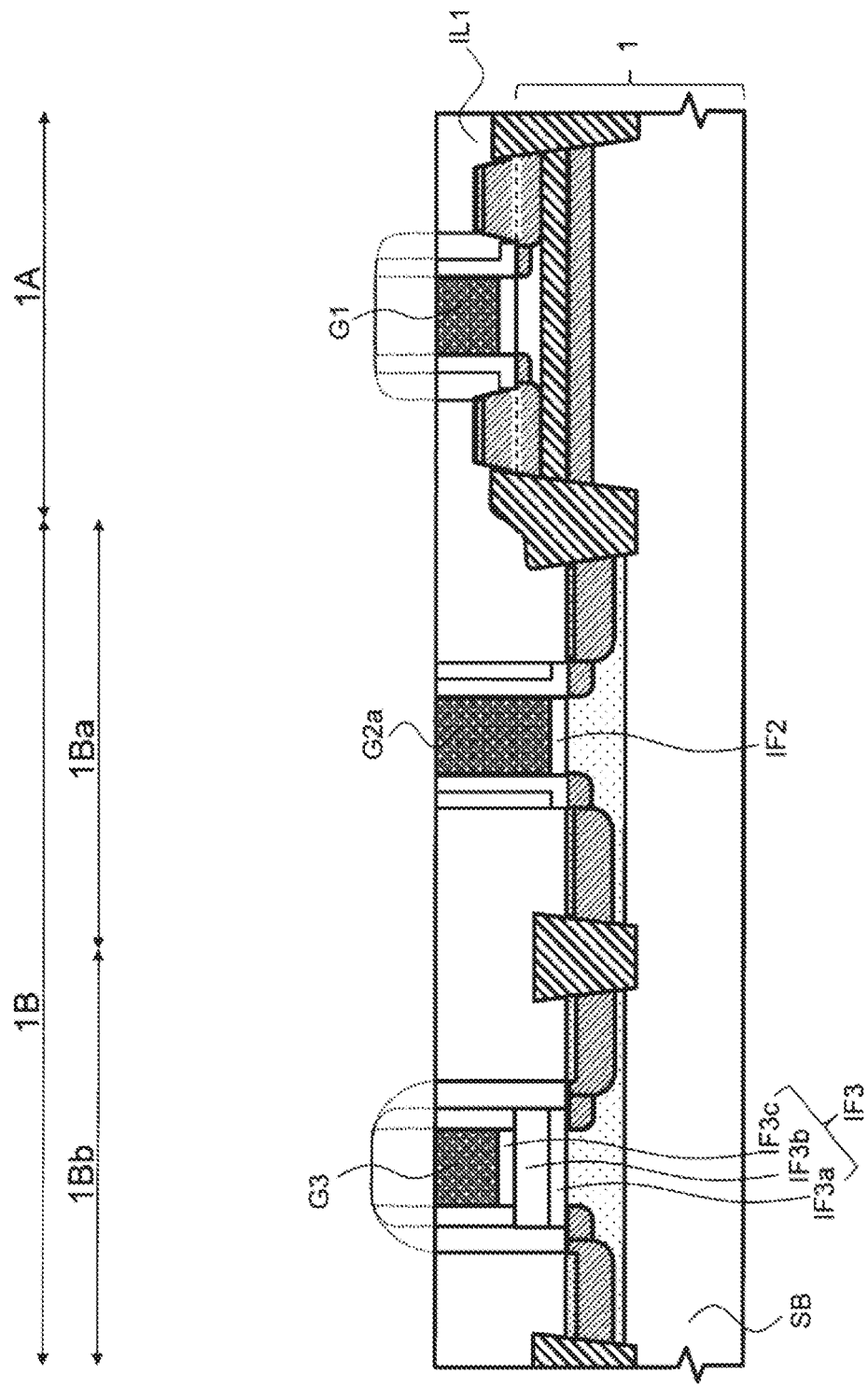
FIG. 17 is a main portion cross-sectional view during the manufacturing process of the semiconductor device of examined example 1 following FIG. 16.

Here, as shown in FIG. 16, in the examined example 1, since the epitaxial growth treatment is not performed on the first region 1Ba in the bulk region 1B, the surfaces (upper surface) of the gate electrodes G1, G2a, and G3 are not located at the substantially same height. Specifically, the surface of the gate electrode G2a formed in the first region 1Ba in the bulk region 1B is lower than the surface of the gate electrodes G1 and G3 formed in the other regions 1A and 1Bb. Therefore, in such a configuration, when the interlayer insulating film IL1 is polished so that all of the gate electrodes G1, G2a, and G3 formed in the regions 1A and 1B (1Ba and 1Bb) are exposed from the interlayer insulating film IL1, the gate electrodes G1 and G3 are polished (removed) more than necessary, as shown in FIG. 17. As a result, the metal gate electrodes formed by the later replacement process may not have a desired form (thickness), and the electric characteristics (i.e., reliability of the semiconductor device) may be deteriorated.

Examined Example 2

Figure 18:
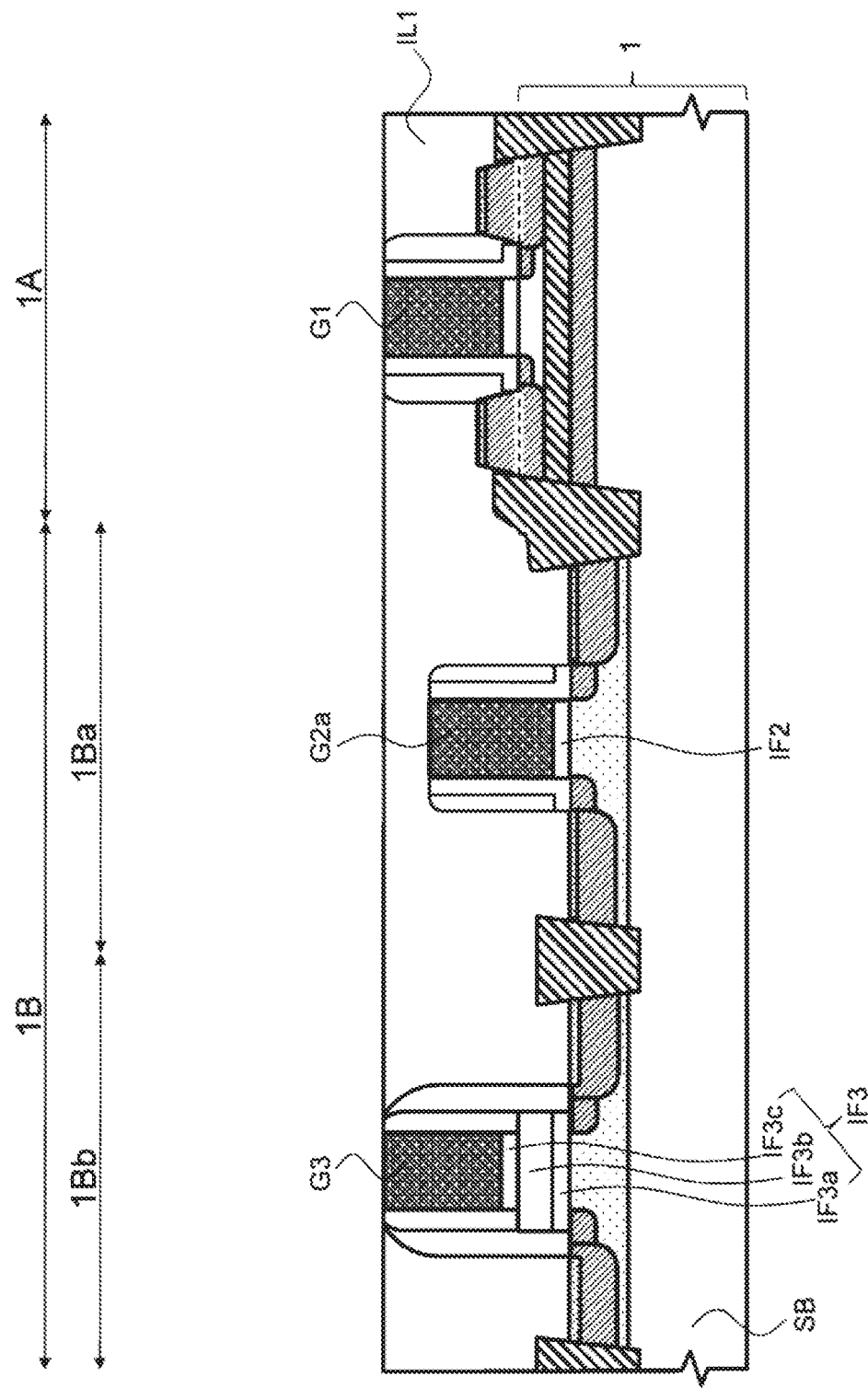
FIG. 18 is a main portion cross-sectional view during the manufacturing process of the semiconductor device of examined example 2.

The present inventors also reviewed the examined example 2 in which the polishing of the interlayer insulating film IL1 is terminated when the gate electrodes G1 and G3 protruding above the substrate 1 from the gate electrode G2a are exposed. However, in the examined example 2, as shown in FIG. 18, of all the gate electrodes G1, G2a, and G3, the gate electrode G2a whose upper surface is located closest to the semiconductor base material SB constituting the substrate 1 is not exposed from the interlayer insulating film IL1. As a result, the material (for example, a polycrystalline silicon film) constituting the gate electrode G2a cannot be replaced with another material (for example, a metallic film). That is, it is difficult to improve the processing speed of the circuit including the gate electrode G2a.

Examined Example 3

Figure 19:
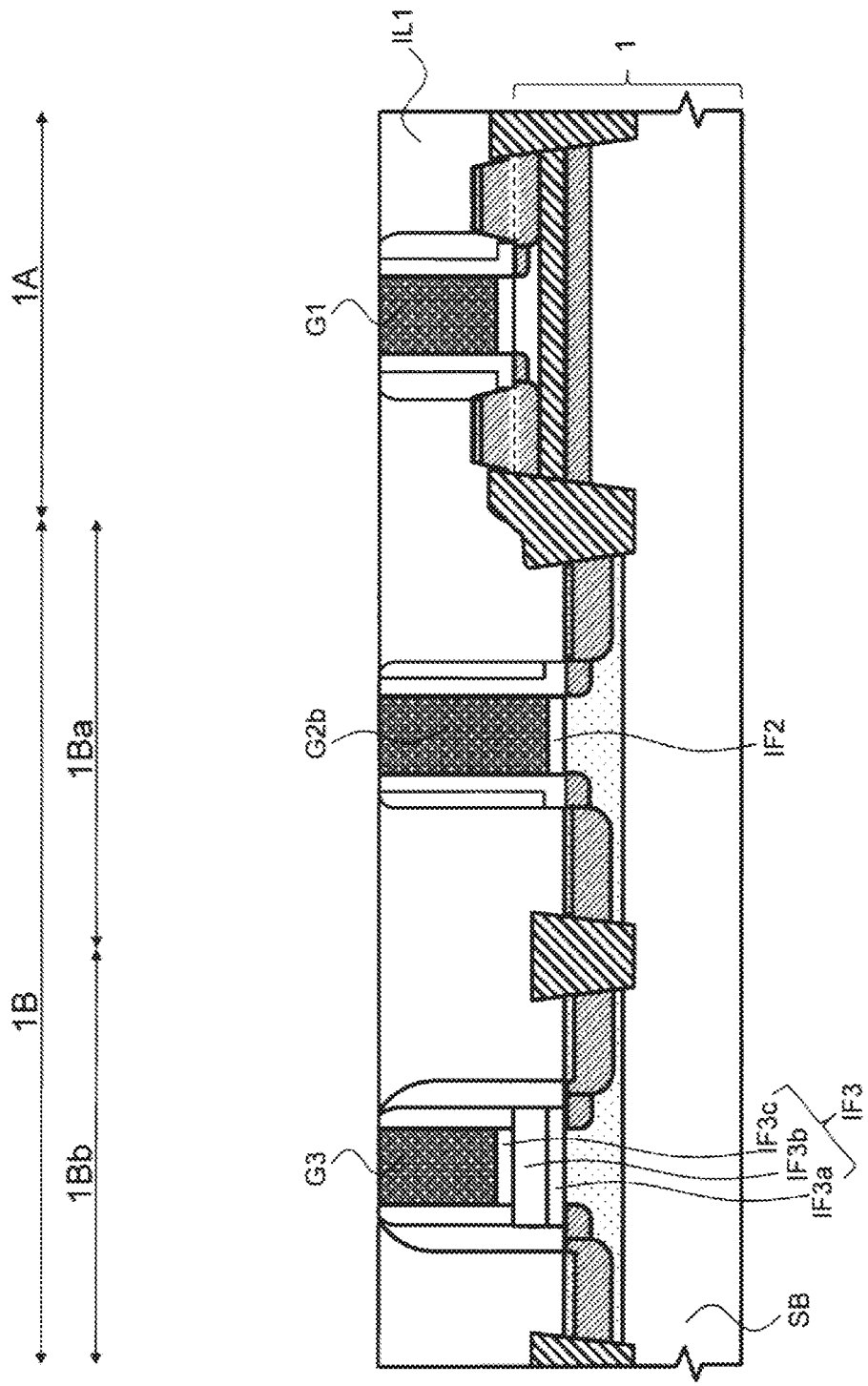
FIG. 19 is a main portion cross-sectional view during the manufacturing process of the semiconductor device of examined example 3.
Figure 20:
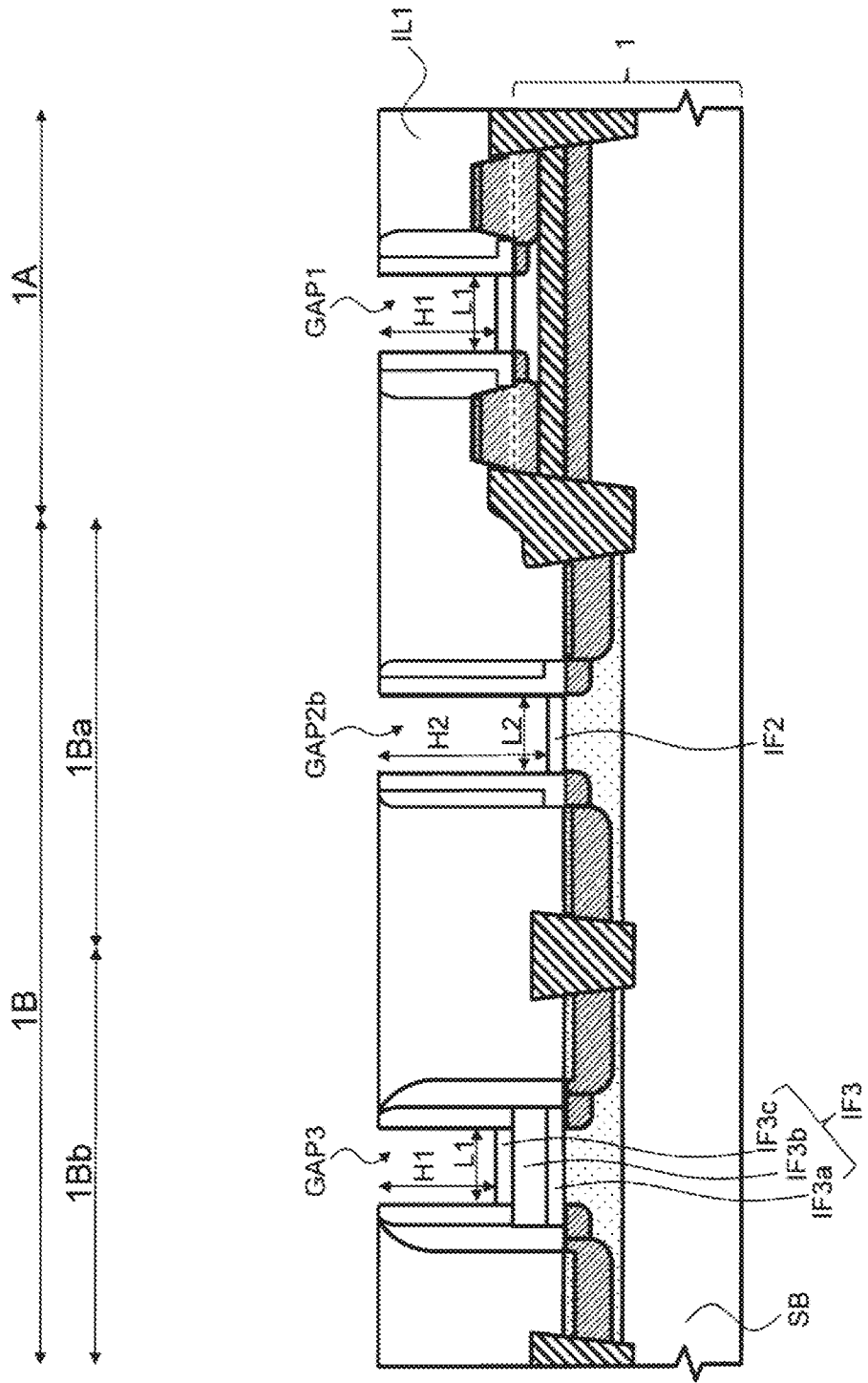
FIG. 20 is a main portion cross-sectional view during the manufacturing process of the semiconductor device of examined example 3 following FIG. 19.

Therefore, the present inventor reviewed adopting, as a new examined example, the gate electrode G2b which is higher (thicker) than the height (thickness) of the gate electrode G2a. As a result, as shown in FIG. 19, the gate electrodes G1, G2b, and G3 can be exposed from the interlayer insulating film IL1 without unnecessarily polishing or removing the gate electrodes G1, G2b, and G3. However, in the present examined example 3, as shown in FIG. 20, the aspect ratio (H2/L2) of the gap GAP2b formed by performing a part of the substitution step on the gate electrode G2b becomes larger than the aspect ratio (H1/L1) of the space formed by performing a part of the substitution step on the gate electrode G2a in the examined example 1, that is, the aspect ratio (OOF) of the space formed by performing a part of the substitution step on the other gate electrodes. As a result, it becomes difficult to bury the metallic film in the formed gap GAP2b. That is, the formed metal gate electrodes may have voids, which may reduce the reliability of the semiconductor device.

Examined Example 4

Figure 21:
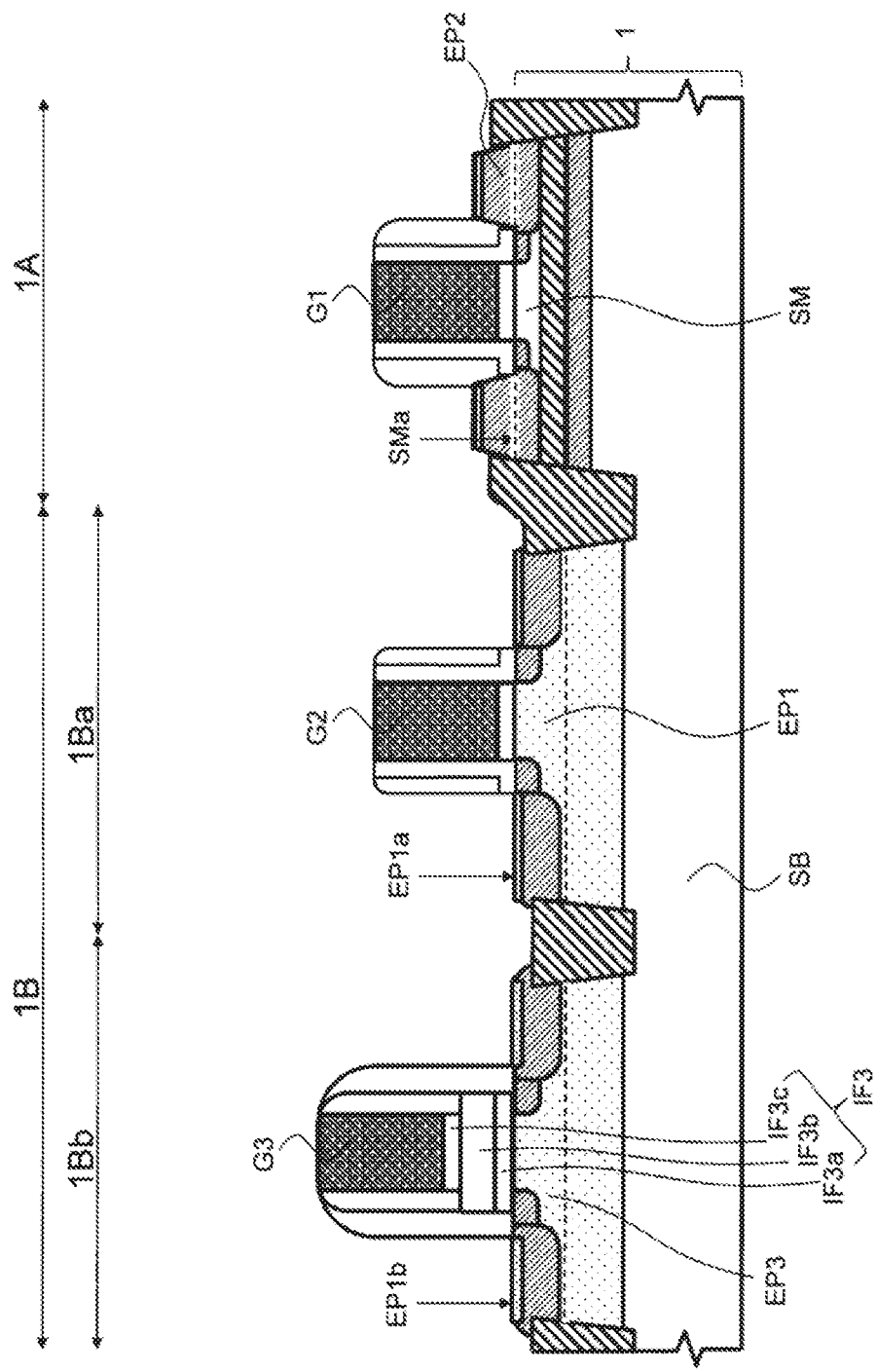
FIG. 21 is a main portion cross-sectional view during the manufacturing process of the semiconductor device of examined example 4.

As described above, the substrate constituting the semiconductor device of the present first embodiment includes not only the SOI region (e.g., the SOI region 1A) having the insulating layer and the semiconductor layer formed on the semiconductor base material, but also the bulk region (e.g., the bulk region 1B) not having the insulating layer and the semiconductor layer. That is, the surface (upper surface) of the gate electrode of the MISFET formed in the bulk region 1B is located lower than the surface (upper surface) of the gate electrode of the MISFET formed in the SOI region 1A in the cross-sectional view. Therefore, as a further examined example, the present inventor has considered that, as shown in FIG. 21, after removing the semiconductor layer and the insulating layer located in the bulk region 1B, the epitaxial growth treatment is performed on all the bulk regions 1B, that is, both the first region 1Ba and the second region 1Bb, thereby reducing the level difference caused by the removal of both the semiconductor layer and the insulating layer. In other words, the epitaxial growth treatment is performed on the respective regions 1Ba and 1Bb so that not only the upper surface EP1a of the epitaxially grown layer EP1 but also the upper surface EP1b of the epitaxially grown layer EP3 are located at the substantially same height as the upper surface SMa of the semiconducting layer SM located in the SOI region 1A.

However, as shown in FIG. 21, the thickness of the gate insulating film IF3 of the MISFET formed in the second region 1Bb in the bulk region 1B is thicker than the thickness of the gate insulating films IF1 and IF2 of the MISFET formed in the other regions 1A and 1Ba. Therefore, similarly to examined example 1 and examined example 2, the surfaces (upper surface) of the respective gate electrodes G1, G2, and G3 cannot be positioned at substantially the same height prior to the polishing step.

In contrast, in the present first embodiment, as shown in FIGS. 2, 6, and 15, the epitaxial growth treatment is performed on the first region 1Ba of the bulk region 1B in which the field effect transistor (MISFET) Q2 having the thin gate insulating film IF2 is formed, but the epitaxial growth treatment is not performed on the second region 1Bb of the bulk region 1B in which the field effect transistor (MISFET) Q3 having the thick gate insulating film IF3 is formed. Therefore, as shown in FIG. 8, the surfaces (upper surface) of the gate electrodes G1, G2, and G3 can be positioned at the substantially same height as each other prior to the step of polishing the interlayer insulating film IL. As a result, as shown in FIGS. 11 to 14, since the metal gate electrodes MTG1, the MTG2, and the MTG3 having the substantially same shapes (thicknesses) as those of the temporary gate electrodes G1, G2, and G3 formed in advance can be formed, it is possible to suppress deterioration of the reliability of the semiconductor device. In other words, since metal gate electrodes having desired shapes can be employed for the respective MISFET, it is possible to realize high-speed semiconductor device. Further, in the present first embodiment, as described above, the surfaces (upper surface) of the gate electrodes G1, G2, and G3 are positioned at the substantially same height as each other prior to the polishing step of the interlayer insulating film IL, so that the polishing condition (polishing quantity) in the subsequent polishing step can be easily set. That is, since all the gate electrodes can be easily exposed from the polished interlayer insulating film IL1 in a stable manner, the yield of semiconductor device can be improved.

Modified Example of First Embodiment

Next, the modified example of the present first embodiment will be described.

Modified Example 1

First, in the above first embodiment, as described with reference to FIG. 5, the semiconductor layer SM located in the bulk region 1B is removed, ions are implanted into the semiconductor base material SB located in the SOI region 1A, ions are implanted into the semiconductor base material SB located in the bulk region 1B, and then the insulating layer BX located in each of the SOI region 1A and the bulk region 1B is removed. In contrast, in the present first modified example, first, after the semiconductor layer SM located in the bulk region 1B is removed, ions are implanted into the semiconductor base material SB located in the bulk region 1B, and further, ions are implanted into the semiconductor base material SB located in the SOI region 1A, after which the insulating layer BX located in each of the SOI region 1A and the bulk region 1B is removed. In each of the above first embodiment and the present first modified example, the type of the photoresist pattern used in the etch process for removing the semiconductor layer SM and the insulating layer BX and the type of the photoresist pattern used in the ion implantation process differ from each other.

Modified Example 2

Next, in the above first embodiment, as a specific example in the elevation processing, as described with reference to FIG. 6, the epitaxial growth treatment has been described so that the upper surface EP1a of the epitaxially grown layer EP1 is located at a height higher than the upper surface SBab of the semiconductor base material SB located in the second region 1Bb in the bulk region 1B, and so that it is located at the same height as the upper surface SMa of the semiconductor layer SM located in the SOI region 1A, or is located at a height lower than the upper surface SMa of the semiconductor layer SM located in the SOI region 1A. On the other hand, in the present second modified example, the epitaxial growth treatment is performed so that the upper surface EP1a of the epitaxially grown layer EP1 is located at a height higher than the upper surface SMa of the semiconductor layer SM located in the SOI region 1A. However, if the upper surface EP1a of the epitaxially grown layer EP1 is excessively higher (thicker) than the upper surface SMa of the semiconducting layer SM, not only does the epitaxial growth treatment take longer, but the gate electrodes G2a formed in the first regions 1Ba are polished (removed) unnecessarily in a later polishing step. Therefore, when it is difficult to control the epitaxial growth so that the upper surface EP1a of the epitaxially grown layer EP1 becomes the same height as the upper surface SMa of the semiconductor layer SM, it is preferable to perform the epitaxial growth treatment so that the upper surface EP1a of the epitaxially grown layer EP1 is located at the same height as the upper surface SMa of the semiconductor layer SM or at a lower height than the upper surface SMa of the semiconductor layer SM as in the above-mentioned first embodiment in view of the time required for the epitaxial growth treatment.

Modified Example 3

Next, in the above first embodiment, as shown in FIG. 5, the well WEL is formed at a position adjoining the insulating layer BX located in the bulk region 1B (in particular, the first region 1Ba), the first region 1Ba is subjected to an elevation process (i.e., an epitaxial growth treatment), and then the well WEL is formed in the epitaxially grown layer EP1 formed by the elevation process. In contrast, in the present third modified example, in the first area 1Ba, the ion implantation process is performed only after the elevation process is performed without performing the ion implantation process prior to the elevation process. That is, when ion implantation is performed on the second region 1Bb of the bulk region 1B, the first region 1Ba is covered with a photo resist pattern. According to the present third modified example, since the number of ion implantations into the first region 1Ba can be reduced, the variation in the threshold voltage of the second field-effect transistor Q2 formed in the first region 1Ba can be reduced compared to the threshold voltage first embodiment.

Modified Example 4

Next, in the above first embodiment, the field-effect transistor Q3 formed in the second area 1Bb and constituting the flash memory circuit has the gate insulating film IF3 formed of the insulating layer IF3a made of silicon oxide, the insulating layer IF3b made of silicon nitride and formed on the insulating layer IF3a, and the insulating layer IF3c made of silicon oxide and formed on the insulating layer IF3b. On the other hand, the present fourth modified example relates to a ferroelectric memory as a MISFET constituting another memory circuit. More specifically, the gate electrode of the MISFET of the present fourth modified example is formed on the semiconductor base material SB located in the second area 1Bb, and is formed on the semiconductor base material SB via an insulating layer made of silicon oxide, an insulating layer made of silicon oxide and containing hafnium (e.g., HfSiO or HfZrO2), and a capping film made of titanium nitride and formed on the insulating layer containing hafnium. The insulating layer containing hafnium located in the center is a ferroelectric film. The ferroelectric film is the thickest of the three layers described above. However, the maximum thickness of the ferroelectric film is about 10 nm, which is thinner than the maximum thickness (about 13 nm) of the insulating layer (charge retaining layer, charge storage layer) IF3b of the first embodiment.

Modified Example 5

Figure 22:
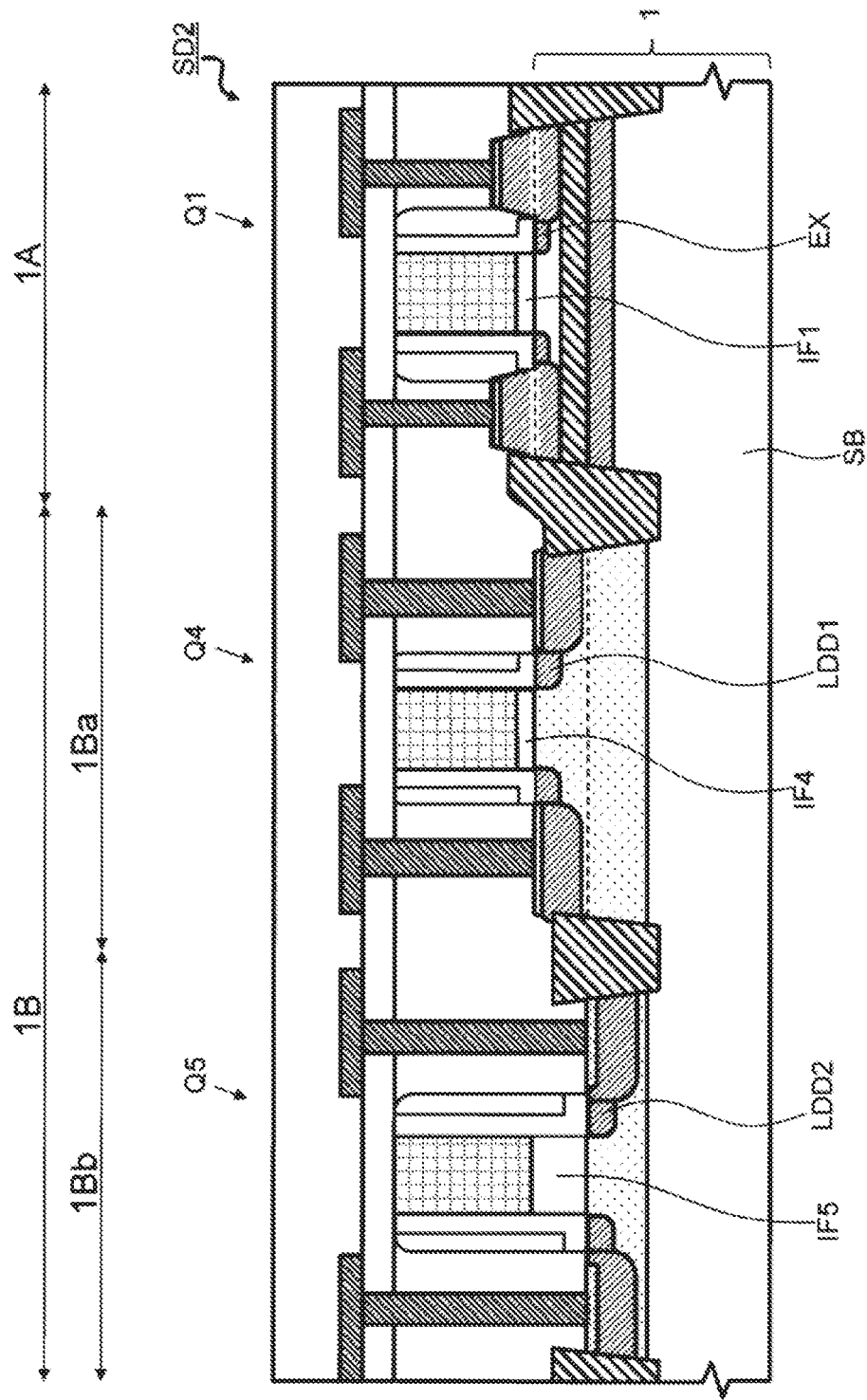
FIG. 22 is a main portion cross-sectional view of semiconductor device according to the modified example of first embodiment.

Further, in the above first embodiment, it has been described that the MISFET having the three-layer gate insulating film IF3 is formed in the second region 1Bb of the bulk region 1B. In contrast, in the present fifth modified example, the gate insulating film of the MISFET formed in the second area 1Bb is formed in one layer. More specifically, as shown in FIG. 22, in the semiconductor device SD2 of the present fifth modified example, a low breakdown voltage field effect transistor (MISFET) Q4 is formed in the first region 1Ba of the bulk region 1B, and a high breakdown voltage field effect transistor (MISFET) Q5 is formed in the second region 1Bb of the bulk region 1B. As shown in FIG. 22, the thickness of the gate insulating film IF5 constituting the high breakdown voltage field effect transistor Q5 is thicker than the thickness of the gate insulating film IF4 constituting the low breakdown voltage field effect transistor Q4. The thickness of the gate-insulating film IF4 in the present fifth modified example is, for example, 2 nm to 4 nm. The thickness of the gate-insulating film IF5 in the present fifth modified example is, for example, 9 nm to 21 nm. The thicknesses of the gate insulating films IF4 and IF5 vary depending on the required withstand voltage. Therefore, the thickness of the gate insulating film constituting the high breakdown voltage field-effect transistor may be, for example, half or less of the thickness (9 nm to 21 nm) of the gate insulating film IF3 of the first embodiment. When a metal gate electrode is also to be employed for the gate electrode of such a high breakdown voltage type field effect transistor, it is necessary to perform an elevation process also for the region in which the high breakdown voltage type field effect transistor is formed, here, the second region 1Bb. In the present modified example, the thickness of the gate insulating film IF5 of the high breakdown voltage type field effect transistor Q5 is larger than the thickness of the gate insulating film IF4 of the low breakdown voltage type field effect transistor Q4, but the gate length of the high breakdown voltage type field effect transistor Q5 may be larger than the gate length of the low breakdown voltage type field effect transistor Q4. Here, the "gate length" is the length of the gate electrode along the direction from one to the other of the two semiconductor regions LDD serving as the source/drain in FIG. 22. Further, the gate length of the high breakdown voltage field effect transistor Q5 and the thickness of the gate insulating film IF5 may be larger than the gate length of the low breakdown voltage field effect transistor Q4 and the thickness of the gate insulating film IF4, respectively. Note that the materials constituting the gate insulating film, the metal gate electrodes, the offset spacers, the semiconductor regions serving as the source/drain regions, and the like other than the above are the same as those described in the above first embodiment and each modified example, and thus descriptions thereof are omitted.

Second Embodiment

Figure 23:
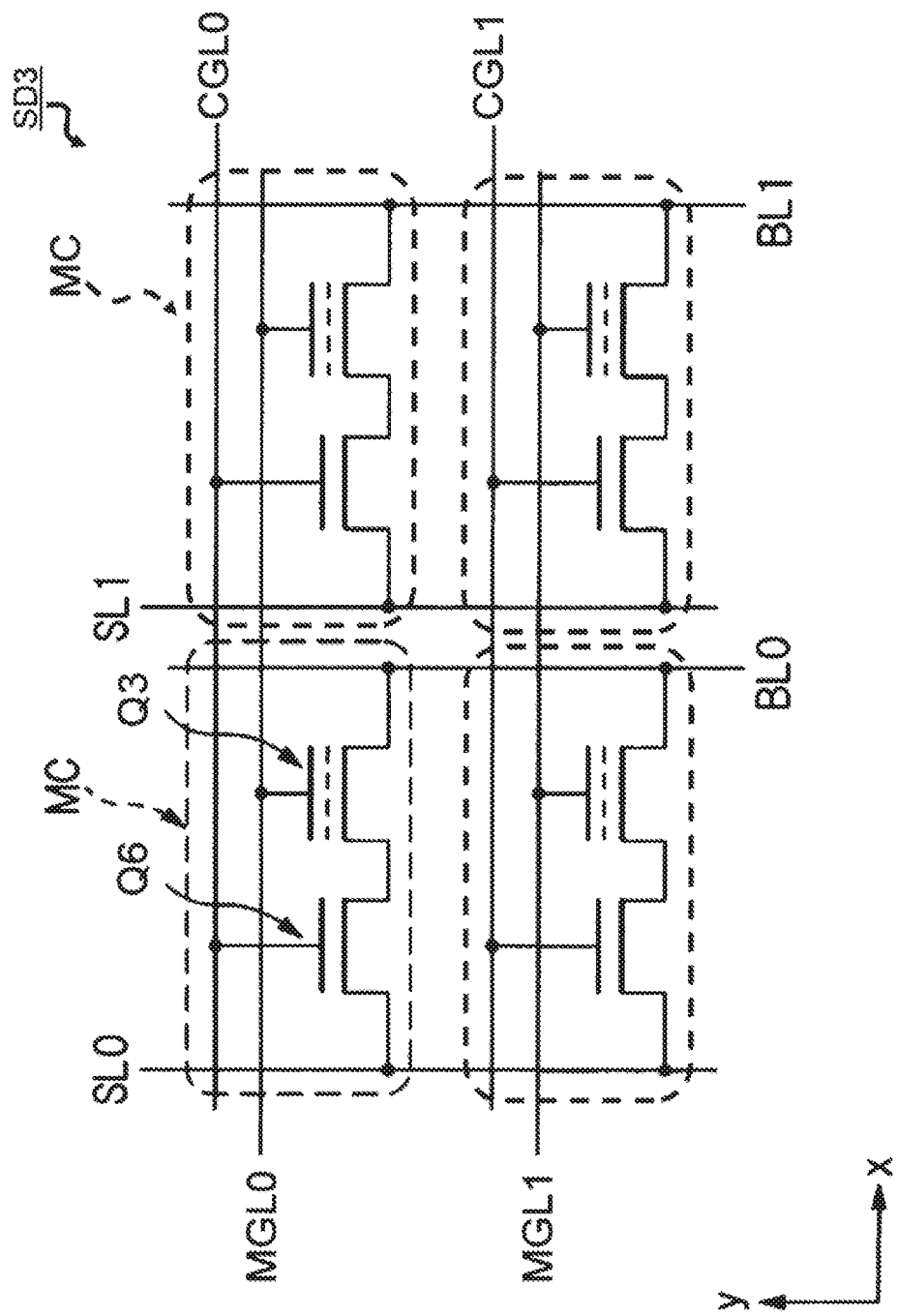
FIG. 23 is a schematic diagram of the semiconductor device of the second embodiment.
Figure 24:
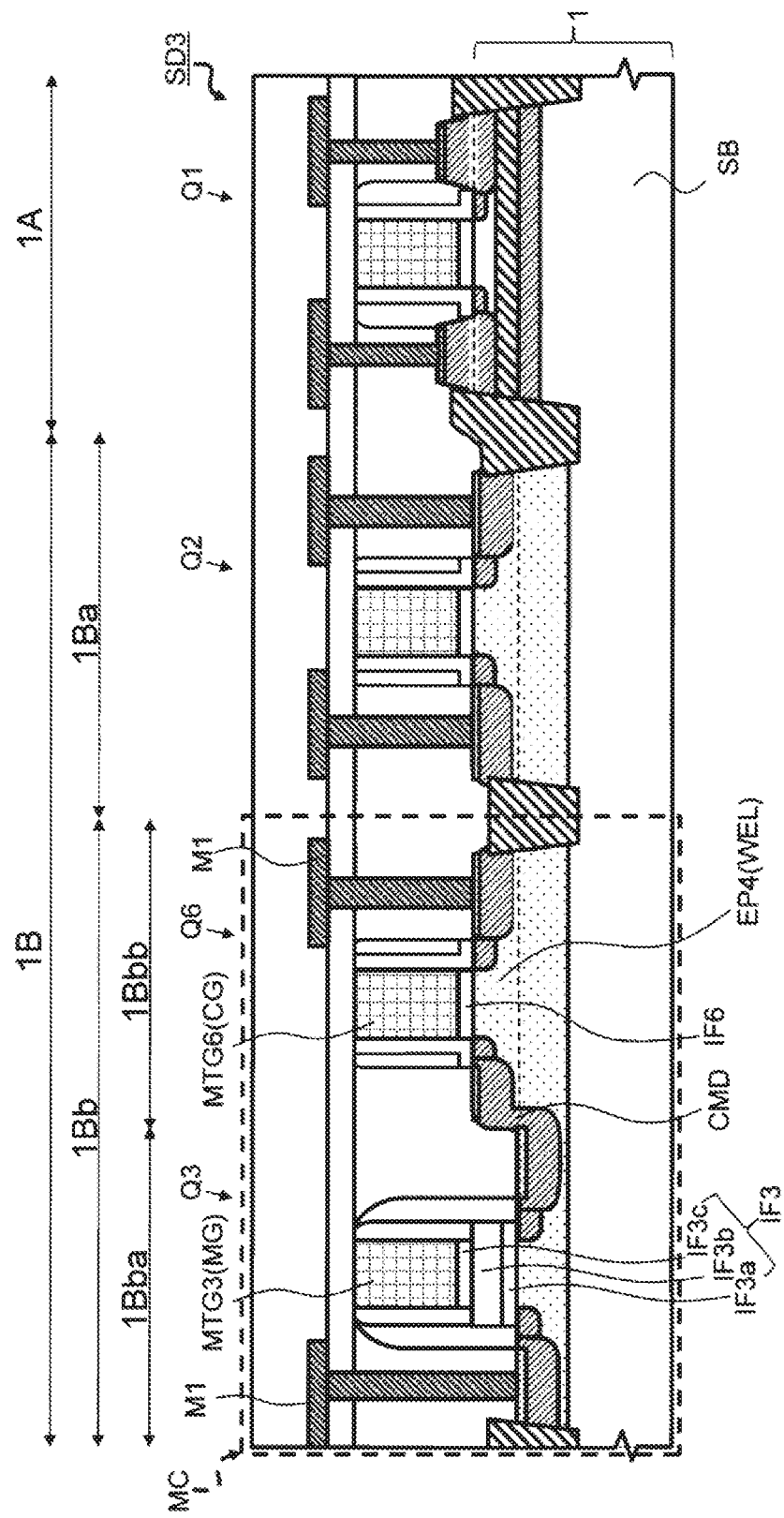
FIG. 24 is a main portion cross-sectional view of the semiconductor device of second embodiment.

Next, the semiconductor device SD3 of the present second embodiment will be described with reference to FIGS. 23 and 24. FIG. 23 is a schematic diagram of semiconductor device SD3 of present second embodiment. FIG. 24 is a main portion cross-sectional view of a semiconductor device of a second embodiment including one of the plurality of memory cells MCs shown in FIG. 23. It is to be noted that the difference from the above-mentioned first embodiment is that, first, in the above-mentioned first embodiment, one (one type) field effect transistor (MISFET) Q3 is formed in the second region 1Bb which is one active region in the bulk region 1B, but in the present second embodiment, as shown in FIGS. 23 and 24, two (two types) field effect transistors (MISFET) Q3 and Q6 are formed in the second region 1Bb which is one active region in the bulk region 1B, which is different from the above-mentioned first embodiment. Other configurations are the same as those described in the above first embodiment and the respective modified example, and therefore descriptions thereof are omitted.

As shown in FIG. 23, each of the plurality of memory cells MC includes a field effect transistor (memory transistor) Q3, and a field effect transistor (selection transistor) Q6 connected in series with the field effect transistor Q3 and controlling (selecting) the field effect transistor Q3. The gate electrode (metal gate electrode MTG3) of the field-effect transistor Q3 is electrically connected to the corresponding memory gate lines (word lines) MGL0 and MGL1. That is, the gate electrode of the field effect transistor Q3 is the memory gate electrode MG. On the other hand, a gate electrode (metal gate electrode MTG6) of the field-effect transistor Q6 is electrically connected to corresponding control gate lines (select gate lines) CGL0 and CGL1. That is, the gate electrode of the field effect transistor Q6 is the control gate electrode (select gate electrode) CG. The source/drain of the field-effect transistor Q3 is electrically connected to the bit lines BL0 and BL1. The source/drain of the field-effect transistor Q6 is electrically connected to the source lines SL0 and SL1.

As shown in FIG. 24, the semiconductor device of the present second embodiment has a common semiconductor region (diffusion region, impurity region) CMD extending over a memory transistor formation region (memory transistor formation portion) 1Bba in which the memory transistor Q3 is formed and a selection transistor formation region (selection transistor formation portion) 1Bbb in which the selection transistor Q6 is formed in the second region 1Bb of the bulk region 1B. Specifically, the common semiconductor region CMD is formed in both of the semiconductor base material SB located in the memory transistor forming region 1Bba and the epitaxially grown layer EP4 formed on the semiconductor base material SB located in the control transistor forming region 1Bbb. That is, the common semiconductor region CMD is a semiconductor region (diffusion region, impurity region) serving as a drain of the field effect transistor Q3, and is also a semiconductor region (diffusion region, impurity region) serving as a source of the field effect transistor Q6.

In present second embodiment, as shown in FIG. 24, the thickness of the gate insulating film IF6 of the control transistor Q6 is smaller than the thickness of the gate insulating film IF3 of the memory transistor Q3. That is, the thickness of the gate-insulating film IF6 of the control transistor Q6 is, for example, 2 nm to 8 nm. Therefore, as shown in FIG. 24, the epitaxially grown layer EP4 is formed on the semiconductor base material SB located in the selection transistor forming region 1Bbb of the second region 1Bb. Incidentally, in the same manner as in the above first embodiment, an impurity is implanted into the epitaxially growth layer EP4 formed in the control transistor forming region 1Bbb. In other words, a well (semiconducting regions and impurity regions) WEL is also formed in the epitaxially grown layer EP4.

The epitaxially grown layer EP4 formed in the selection transistor forming region 1Bbb is formed by performing epitaxial growth treatment also on the selection transistor forming region 1Bbb when performing epitaxial growth treatment on the first region 1Ba of the bulk region 1B in step S3 (elevation processing) shown in the process flow of FIG. 3, for example. However, the epitaxial growth treatment for the selection transistor forming region 1Bbb may be performed in a step different from the epitaxial growth treatment for the first region 1Ba.

(Effect Due to Method of Manufacturing Semiconductor Device of Second Embodiment)

Next, the effects due to the method of manufacturing the semiconductor device of the present second embodiment will be described.

In present second embodiment, as shown in FIG. 24, in the bulk region 1B, the epitaxial growth treatment is performed on the first region 1Ba in which the field effect transistor (MISFET) Q2 having the thin gate insulating film IF2 is formed and the selection transistor forming region 1Bbb in which the field effect transistor (MISFET) Q6 having the same thin gate insulating film IF6 is formed, but the epitaxial growth treatment is not performed on the selection transistor forming region 1Bbb in which the field effect transistor (MISFET) Q3 having the thick gate insulating film IF3 is formed in the bulk region 1B. Therefore, the surfaces (upper surface) of the gate electrodes formed in the regions 1A, 1Ba, 1Bba, and 1Bbb can be positioned at the substantially same height as each other prior to the step of polishing the interlayer insulating film IL, as described in the above first embodiment. As a result, the metal gate electrodes MTG1, the metal gate electrodes MTG2, the metal gate electrodes MTG3, and the metal gate electrodes MTG6 having the substantially same shapes (thicknesses) as those of the temporary gate electrodes formed in advance can be formed in the same manner as described in the above first embodiment, so that the reliability of the semiconductor device can be suppressed from being lowered. In other words, even if two types of MISFET having gate insulating films IF3 and IF6 having different thicknesses from each other are formed in one active area, metal gate electrodes having desired shapes for each MISFET can be employed, and therefore, high-speed semiconductor device can be realized.

The invention made by the present inventor has been described above in detail based on the embodiment, but the present invention is not limited to the embodiment described above, and it is needless to say that various modifications can be made without departing from the gist thereof.

In addition, some of the contents described in the above embodiment mode will be described below.

[Additional Statement 1]

A base material including a substrate, a first field effect transistor formed in a first region of the substrate, a second field effect transistor formed in a second region of the substrate, and a third field effect transistor formed in a third region of the substrate, wherein the first region includes a first portion of the base material, an insulating layer formed on the first portion of the base material, and a semiconductor layer formed on the insulating layer, wherein a first gate electrode of the first field effect transistor is formed on the semiconductor layer via a first gate insulating film, wherein the second region includes a second portion of the base material and an epitaxially grown layer formed on the second portion of the base material, wherein a second gate electrode of the second field effect transistor is formed on the epitaxially grown layer via a second gate insulating film, wherein the third region includes a third portion of the substrate, wherein a third gate electrode of the third field effect transistor is formed on the third portion of the base material via a third gate insulating film, wherein a thickness of the third gate insulating film is larger than a thickness of each of the first gate insulating film and the second gate insulating film, wherein each of the first gate electrode, the second gate electrode and the third gate electrode is made of a metallic material, and wherein each of the first gate electrode, the second gate electrode and the third gate electrode is made of the substantially same thickness as one another.

What is claimed is:

1. A method of manufacturing a semiconductor device, comprising:
   (a) preparing a substrate including a semiconductor base material, an insulating layer formed on the semiconductor base material, and a semiconductor layer formed on the insulating layer;
   (b) after the (a), removing the semiconductor layer located in a bulk region of the substrate and the insulating layer located in the bulk region;
   (c) after the (b), performing an epitaxial growth treatment on a surface of the semiconductor base material located in a first region of the bulk region;
   (d) after the (c), forming a first gate electrode on the semiconductor layer located in a SOI region of the substrate via a first gate insulating film, a second gate electrode on the semiconductor base material located in the first region of the bulk region and on which the epitaxial growth treatment is performed via a second gate insulating film, and a third gate electrode on the semiconductor base material located in a second region of the bulk region and on which the epitaxial growth treatment is not performed via a third gate insulating film, respectively,
   wherein a thickness of the third gate insulating film is larger than a thickness of each of the first gate insulating film and the second gate insulating film, and
   wherein each of the first gate electrode, the second gate electrode and the third gate electrode is made of a first material;
   (e) after the (d), forming an interlayer insulating film on the substrate so as to cover each of the first gate electrode, the second gate electrode and the third gate electrode;
   (f) after the (e), polishing the interlayer insulating film, and exposing each of the first gate electrode, the second gate electrode and the third gate electrode from the interlayer insulating film; and
   (g) after the (f), displacing the first material, that comprises each of the first gate electrode, the second gate electrode and the third gate electrode, to a second material, which is different from the first material.

2. The method according to claim 1, wherein, in the (c), the epitaxial growth treatment is performed such that an upper surface of an epitaxially grown layer formed in the (c)

and with which the second gate insulating film is to be in contact is located at a height:
  which is higher than an upper surface of the semiconductor base material located in the second region and with which the third gate insulating film is to be in contact, and
  which is equal to or lower than an upper surface of the semiconductor layer with which the first gate insulating film is to be in contact.

3. The method according to claim 2, wherein the thickness of the third gate insulating film is larger than a thickness of one of the semiconductor layer and the insulating layer.

4. The method according to claim 2,
  wherein, after the (g), a first field effect transistor including the first gate electrode made of the second material is formed in the SOI region, a second field effect transistor including the second gate electrode made of the second material is formed in the first region of the bulk region, and a third field effect transistor including the third gate electrode made of the second material is formed in the second region of the bulk region, and
  wherein a gate length of the third gate electrode comprising the third field effect transistor is longer than a gate length of the second gate electrode comprising the second field effect transistor.

5. The method according to claim 2, wherein the third gate insulating film is comprised of:
  a first silicon oxide film,
  an insulating film having a dielectric constant greater than a dielectric constant of the first silicon oxide film, and
  a second silicon oxide film formed on the insulating film.

6. The method according to claim 2, wherein the third gate insulating film has:
  a first insulating layer comprised of silicon oxide,
  a second insulating layer comprised of silicon nitride and formed on the first insulating layer, and
  a third insulating layer comprised of silicon oxide and formed on the second insulating layer.

7. The method according to claim 6,
  wherein the first material is polycrystalline silicon, and
  wherein the second material is metal.

8. The method according to claim 7, wherein, after the (d) and before the (e), an epitaxial growth treatment is performed on a surface of a portion, which is exposed from the first gate electrode, of the semiconductor layer located in the SOI region.

9. A method of manufacturing a semiconductor device, comprising:
  (a) preparing a substrate including a semiconductor base material, an insulating layer formed on the semiconductor base material, and a semiconductor layer formed on the insulating layer;
  (b) after the (a), removing the semiconductor layer located in a bulk region of the substrate and the insulating layer located in the bulk region;
  (c) after the (b), forming an epitaxially grown layer by performing an epitaxial growth treatment on a surface of the semiconductor base material located in a first region of the bulk region;
  (d) after the (c), forming a first gate electrode on the semiconductor layer located in a SOI region of the substrate via a first gate insulating film, a second gate electrode on the epitaxially grown layer located in the first region of the bulk region, and a third gate electrode on the semiconductor base material located in a second region of the bulk region via a third gate insulating film, respectively, wherein the third gate insulating film has:
  a first insulating layer comprised of silicon oxide,
  a second insulating layer comprised of silicon nitride and formed on the first insulating layer, and
  a third insulating layer comprised of silicon oxide and formed on the second insulating layer,
wherein a thickness of the third gate insulating film is larger than a thickness of each of the first gate insulating film and the second gate insulating film, and
wherein each of the first gate electrode, the second gate electrode and the third gate electrode is made of polycrystalline silicon;
  (e) after the (d), forming an interlayer insulating film on the substrate so as to cover each of the first gate electrode, the second gate electrode and the third gate electrode;
  (f) after the (e), polishing the interlayer insulating film, and exposing each of the first gate electrode, the second gate electrode and the third gate electrode from the interlayer insulating film;
  (g) after the (f), removing each of the first gate electrode, the second gate electrode and the third gate electrode; and
  (h) after the (g), filling a gap formed by the (g) with a metallic film.

10. The method according to claim 9, wherein, in the (c), the epitaxial growth treatment is performed such that an upper surface of the epitaxially grown layer formed in the (c) and with which the second gate insulating film is to be in contact is located at a height:
  which is higher than an upper surface of the semiconductor base material located in the second region and with which the third gate insulating film is to be in contact, and
  which is equal to or lower than an upper surface of the semiconductor layer with which the first gate insulating film is to be in contact.

11. The method according to claim 10, wherein the thickness of the third gate insulating film is larger than a thickness of one of the semiconductor layer and the insulating layer.

12. The method according to claim 10, wherein, after the (d) and before the (e), an epitaxial growth treatment is performed on a surface of a portion, which is exposed from the first gate electrode, of the semiconductor layer located in the SOI region.

13. A method of manufacturing a semiconductor device, comprising:
  (a) preparing a substrate including a semiconductor base material, an insulating layer formed on the semiconductor base material, and a semiconductor layer formed on the insulating layer,
  wherein the substrate has an SOI region and a bulk region,
  wherein the SOI region is a region in which a first field effect transistor is to be formed,
  wherein the bulk region has a first region in which a second field effect transistor is to be formed and a second region in which a memory transistor and a control transistor controlling the memory transistor are to be formed, and
  wherein the second region has a first portion in which the memory transistor is to be formed and a second portion in which the control transistor is to be formed;
  (b) after the (a), removing the semiconductor layer located in the bulk region and the insulating layer located in the bulk region;

(c) after the (b), forming an epitaxially grown layer by performing an epitaxial growth treatment on each of a surface of the semiconductor base material located in the first region and a surface of the semiconductor base material located in the second portion;

(d) after the (c), forming a first gate electrode on the semiconductor layer located in the SOI region via a first gate insulating film, a second gate electrode on the epitaxially grown layer located in the first region via a second gate insulating film, a third gate electrode on the semiconductor base material located in the first portion via a third gate insulating film, and a fourth gate electrode on the epitaxially grown layer located in the second portion via a fourth gate insulating film, respectively, wherein the third gate insulating film has:
  a first insulating layer comprised of silicon oxide,
  a second insulating layer comprised of silicon nitride and formed on the first insulating layer, and
  a third insulating layer comprised of silicon oxide and formed on the second insulating layer, wherein a thickness of the third gate insulating film is larger than a thickness of each of the first gate insulating film, the second gate insulating film and the fourth gate insulating film, and wherein each of the first gate electrode, the second gate electrode, the third gate electrode and the fourth gate electrode is made of a first material;

(e) after the (d), forming an interlayer insulating film on the substrate so as to cover each of the first gate electrode, the second gate electrode, the third gate electrode and the fourth gate electrode;

(f) after the (e), polishing the interlayer insulating film, and exposing each of the first gate electrode, the second gate electrode, the third gate electrode and the fourth gate electrode from the interlayer insulating film; and (g) after the (f), displacing the first material, that comprises each of the first gate electrode, the second gate electrode, the third gate electrode and the fourth gate electrode, to a second material, which is different from the first material.

14. The method according to claim 13, wherein, in the (c), the epitaxial growth treatment is performed such that each of an upper surface of the epitaxially grown layer formed in the (c) and with which the second gate insulating film is to be in contact and an upper surface of the epitaxially grown layer formed in the (c) and with which the fourth gate insulating film is to be in contact is located at a height:
  which is higher than an upper surface of the semiconductor base material located in the second region and with which the third gate insulating film is to be in contact, and
  which is equal to or lower than an upper surface of the semiconductor layer with which the first gate insulating film is to be in contact.

15. The method according to claim 14, wherein the thickness of the third gate insulating film is larger than a thickness of one of the semiconductor layer and the insulating layer.

16. The method according to claim 15,
  wherein the first material is polycrystalline silicon, and
  wherein the second material is metal.

17. The method according to claim 16, wherein, after the (d) and before the (e), an epitaxial growth treatment is performed on a surface of a portion, which is exposed from the first gate electrode, of the semiconductor layer located in the SOI region.

* * * * *